United States Patent [19]
Agrawal

[11] Patent Number: 5,617,042
[45] Date of Patent: *Apr. 1, 1997

[54] MULTIPLE ARRAY PROGRAMMABLE LOGIC DEVICE WITH A PLURALITY OF PROGRAMMABLE SWITCH MATRICES

[75] Inventor: Om P. Agrawal, Los Altos, Calif.

[73] Assignee: Advanced Micro Devices, Inc., Sunnyvale, Calif.

[*] Notice: The term of this patent shall not extend beyond the expiration date of Pat. No. 5,457,409.

[21] Appl. No.: 483,623

[22] Filed: Jun. 7, 1995

Related U.S. Application Data

[63] Continuation of Ser. No. 924,267, Aug. 3, 1992, abandoned.

[51] Int. Cl.$^6$ ............................................... H05K 19/177
[52] U.S. Cl. ................................................. 326/39; 326/41
[58] Field of Search .................................. 307/465, 465.1; 340/825.83, 825.87; 326/39, 40, 41

[56] References Cited

U.S. PATENT DOCUMENTS

| | | | |
|---|---|---|---|
| 4,758,746 | 7/1988 | Birkner et al. | 307/465 |
| 4,771,285 | 9/1988 | Agrawal et al. | 307/465 |
| 4,789,951 | 12/1988 | Birkner et al. | 307/465 |
| 5,015,884 | 5/1991 | Agrawal et al. | 307/465 |
| 5,130,574 | 7/1992 | Shen et al. | 307/465 |
| 5,191,243 | 3/1993 | Shen et al. | 307/465 |
| 5,204,556 | 4/1993 | Shankar | 307/465.1 |
| 5,229,214 | 6/1993 | Pedersen | 307/465 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |

FOREIGN PATENT DOCUMENTS

| | | |
|---|---|---|
| 0445909 | 1/1991 | European Pat. Off. . |

OTHER PUBLICATIONS

Om P. Agrawal, "AMD's Next Generation MACH™ 3xx/4xx Family Breaks New PLD Density/Speed Barrier", *Conference Record, Wescon 92*, pp. 100–106, Nov. 1992.

Raymond Leung et al., "A 7.5 ns 350 mW BiCMOS PAL®–type Device," *Electronic Engineering*, pp. 5.6.1–5.6.4, IEEE 1989 Custom Integrated Circuits Conference.

(List continued on next page.)

*Primary Examiner*—Edward P. Westin
*Assistant Examiner*—Benjamin D. Driscoll
*Attorney, Agent, or Firm*—Skjerven, Morrill, MacPherson Franklin & Friel, LLP; Forrest E. Gunnison

[57] ABSTRACT

The programmable logic device (PLD) of this invention includes two or more programmable logic blocks interconnected by a programmable switch matrix that includes a programmable input switch matrix and a programmable centralized switch matrix. Each programmable logic block is coupled to a plurality of programmable I/O macrocells by an output switch matrix. Each programmable I/O macrocell is connected to one of a plurality of I/O pins for the programmable logic block. In one embodiment, an input macrocell couples an I/O macrocell and the associated I/O pin to the programmable input switch matrix. The programmable input switch matrix provides a uniform treatment of all feedback signals to the programmable centralized switch matrix and thereby simplifies signal routing, provides an improved functionality balance, and improved resource utilization within the PLD. The output switch matrix routes output signals from a programmable logic block to any one of a multiplicity of the I/O macrocells. The output switch matrix and the input switch matrix decouple the programmable logic block and centralized switch matrix from the pin-out and the feedback architecture of the PLD. Thus, the output switch matrix and the input switch matrix may be effectively used with a wide variety of programmable interconnect structures and programmable logic block architectures to achieve enhanced resource utilization, routability and functionality.

52 Claims, 29 Drawing Sheets

OTHER PUBLICATIONS

Electronic Engineering, vol. 63, No. 773, May, 1991, London, GB, pp. 69, 70, 72, 74, "Obtaining 70MHz Performance in the MAX Architecture".

EDN Electrical Design News, vol. 34, No. 20, Sep. 28, 1989, Newton, MA, US, pp. 91, 93, 94, 96, 98, 100, "PLD Architectures Require Scrutiny".

Electronic Design, vol. 33, No. 25, Oct. 1985, Hasbrouck Heights, New Jersey, US, pp. 123–128, 130, "Application–Specific IC's Relying on RAM, Implement Almost any Logic Function".

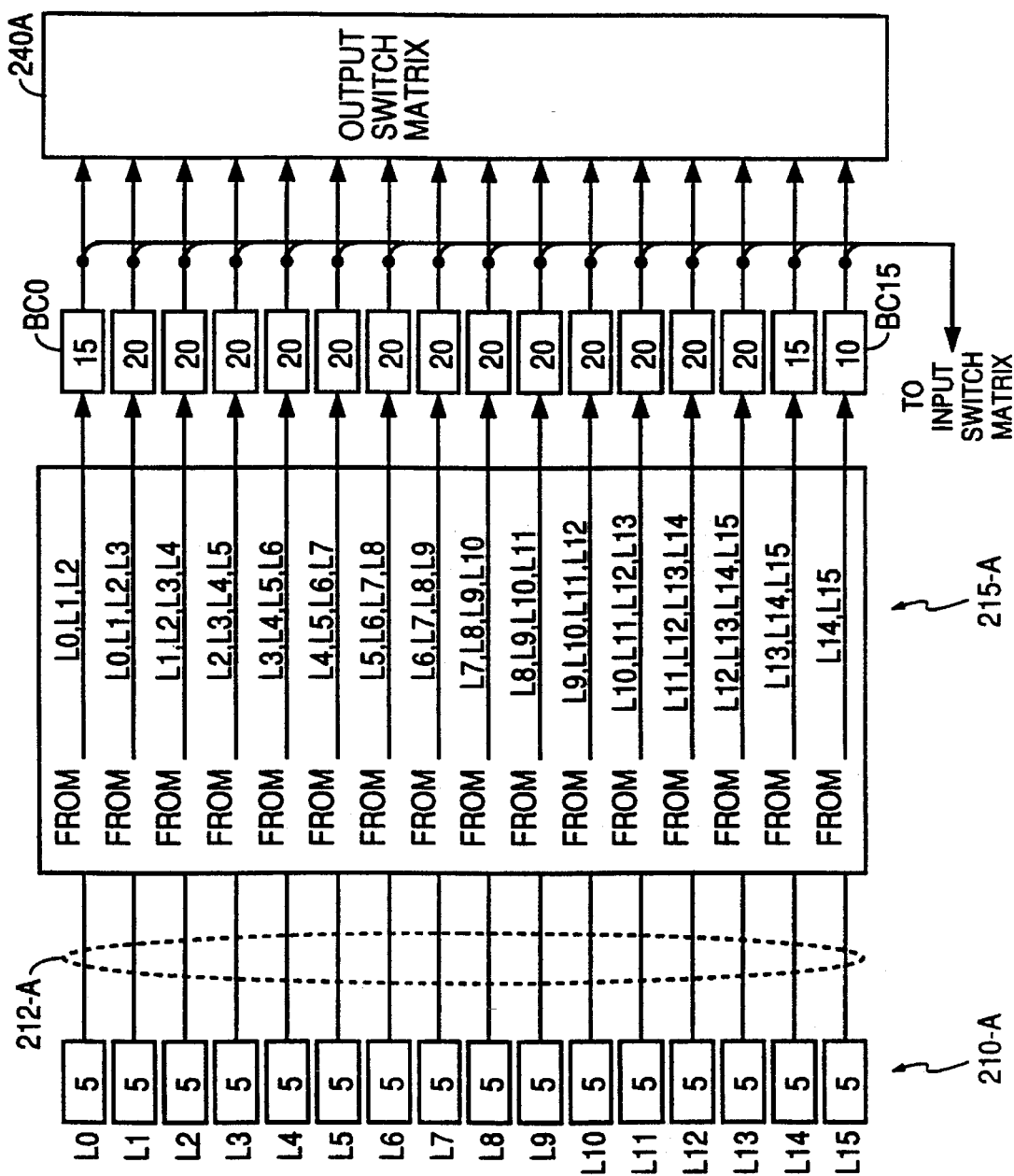

| PLB Input Lines | \multicolumn{8}{c}{Multiplexer Input Lines} | | | | | | | |
|---|---|---|---|---|---|---|---|---|
| 00 | C20 | G21 | C17 | G15 | B08 | G12 | B07 | G06 | B01 |
| 01 | B19 | F19 | B18 | F14 | B11 | F10 | B06 | F06 | C02 |
| 02 | B21 | G23 | B16 | F16 | B10 | F13 | C04 | G07 | D23 |
| 03 | I0 | F23 | C14 | F17 | C09 | F12 | C03 | G08 | A22 |
| 04 | C19 | I4 | C18 | I3 | B12 | G09 | C05 | G04 | B00 |
| 05 | C23 | F21 | I1 | G16 | C12 | G10 | B05 | G05 | A21 |
| 06 | C21 | F20 | B14 | F15 | C11 | F09 | C07 | G03 | A23 |
| 07 | C22 | G19 | B17 | F18 | C13 | F11 | C08 | F05 | C00 |
| 08 | B23 | F22 | C16 | G18 | B13 | G11 | B03 | F03 | B02 |
| 09 | B22 | G20 | B15 | G17 | C10 | F08 | C06 | F04 | C01 |
| 10 | B20 | G22 | C15 | G14 | B09 | G13 | B04 | F07 | D22 |
| 11 | C20 | G22 | B18 | G18 | B10 | F10 | C03 | F07 | B00 |
| 12 | B19 | G20 | B16 | G14 | C09 | G11 | C05 | F06 | A21 |
| 13 | B21 | G21 | C14 | G17 | B12 | G13 | B05 | F03 | A23 |
| 14 | I0 | G19 | C18 | G15 | C12 | F08 | C07 | F07 | C00 |
| 15 | C19 | F20 | I1 | F18 | C11 | C12 | C08 | F04 | B02 |

Fig. 18A

Key to Fig. 18

| Fig. 18A | Fig. 18B |
|---|---|
| Fig. 18C | Fig. 18D |

| PLB Input Lines | Multiplexer Input Lines | | | | | | | |
|---|---|---|---|---|---|---|---|---|
| 00 | G01 | A20 | H16 | D12 | E10 | D06 | H07 | A04 | I5 |
| 01 | G00 | D20 | H17 | A11 | E15 | A07 | E06 | D01 | E00 |
| 02 | H22 | D16 | E20 | A14 | E14 | A08 | H06 | D02 | E03 |
| 03 | F00 | D17 | E16 | A13 | H13 | A06 | E08 | D04 | E04 |
| 04 | G02 | D21 | H21 | A12 | E11 | D10 | H08 | A01 | H04 |
| 05 | F01 | D19 | E17 | D13 | H14 | A09 | E09 | A03 | E02 |
| 06 | E22 | A18 | H18 | A15 | H15 | A05 | E07 | D00 | H01 |
| 07 | H23 | A17 | H20 | D14 | H11 | D08 | H10 | D03 | E01 |
| 08 | E23 | A16 | H19 | D11 | E13 | D09 | E05 | A00 | H00 |
| 09 | E21 | A19 | E18 | D15 | E12 | D05 | H09 | A02 | H03 |
| 10 | F02 | D18 | E19 | A10 | H12 | D07 | H05 | I2 | H02 |
| 11 | F00 | D19 | H21 | A15 | H14 | D08 | H05 | A00 | H03 |
| 12 | H22 | A18 | E16 | D14 | E11 | D09 | E09 | A02 | H02 |
| 13 | G00 | A17 | E20 | D11 | H13 | D05 | H08 | I2 | E02 |
| 14 | E23 | A16 | H17 | D15 | E14 | D07 | E08 | A03 | H04 |
| 15 | F02 | A19 | H19 | A10 | E15 | A09 | H06 | A01 | E04 |

Fig. 18B

| PLB Input Lines | Multiplexer Input Lines | | | | | | | |
|---|---|---|---|---|---|---|---|---|
| 16 | C23 | G21 | B14 | F15 | C13 | F11 | B03 | G06 | C01 |
| 17 | C21 | F19 | B17 | G15 | B13 | F09 | C06 | F05 | D22 |
| 18 | C22 | G23 | C16 | F14 | C10 | G12 | B04 | G03 | A21 |
| 19 | B23 | F23 | B15 | F16 | B09 | F10 | B05 | G06 | B00 |
| 20 | B22 | I4 | C15 | F17 | C12 | F13 | C05 | F06 | A22 |
| 21 | B20 | F21 | I1 | I3 | B12 | F12 | C03 | G07 | D23 |
| 22 | C23 | F20 | C18 | G16 | C09 | G09 | C04 | G08 | C02 |
| 23 | C19 | G19 | C14 | F15 | B10 | G10 | B06 | G04 | B02 |
| 24 | I0 | F22 | B16 | F18 | B11 | F09 | B03 | G05 | D22 |
| 25 | B21 | G20 | B18 | G18 | B13 | F11 | B04 | G03 | C01 |
| 26 | B19 | G22 | C16 | G17 | B09 | G11 | C06 | F05 | B01 |
| 27 | B23 | F21 | C15 | G14 | C10 | F08 | B07 | F03 | C00 |
| 28 | B20 | I4 | B15 | G16 | B08 | G13 | C08 | F04 | A23 |
| 29 | B22 | F23 | C17 | I3 | C13 | G10 | C07 | F07 | B01 |
| 30 | C20 | G23 | B17 | F17 | C11 | G09 | B07 | G05 | C02 |
| 31 | C22 | F19 | B14 | F16 | B08 | F12 | B06 | G04 | D23 |
| 32 | C21 | F22 | C17 | F14 | B11 | F13 | C04 | G08 | A22 |

Fig. 18C

PLB Input Lines | | | Multiplexer Input Lines | | | | | |
---|---|---|---|---|---|---|---|---
16 | E21 | D18 | E19 | D13 | E13 | D10 | E06 | D04 | E03
17 | G01 | D19 | E18 | A12 | H12 | A06 | E05 | D02 | E00
18 | H23 | D21 | H16 | A13 | E12 | A08 | H05 | D01 | H00
19 | E22 | D17 | H20 | A14 | E10 | A07 | H09 | A00 | H02
20 | G01 | D16 | H18 | A11 | H11 | D09 | H07 | I2 | H03
21 | G00 | D20 | H16 | D11 | H15 | D07 | H10 | A02 | I5
22 | H22 | A16 | H17 | A10 | E10 | D05 | E07 | A04 | E01
23 | F00 | D18 | E20 | D15 | E15 | D06 | H07 | D03 | H01
24 | G02 | A19 | E16 | D12 | E14 | D08 | E06 | D00 | I5
25 | F01 | A20 | H21 | D14 | H13 | A05 | H06 | A04 | E00
26 | E22 | A17 | E17 | A15 | E11 | D06 | E08 | D01 | E03
27 | H23 | A18 | H18 | D12 | H14 | A07 | H08 | D02 | E04
28 | E23 | A20 | H20 | A11 | H15 | A08 | E09 | D04 | H04
29 | E21 | D20 | H19 | A14 | H11 | A06 | E07 | A01 | E02
30 | F02 | D16 | E18 | A13 | E13 | D10 | H10 | A03 | H01
31 | F01 | D17 | E19 | A12 | E12 | A09 | E05 | D00 | E01
32 | G02 | D21 | E17 | D13 | H12 | A05 | H09 | D03 | H00

Fig. 18D

| PLB Input Lines | Multiplexer Input Lines | | | | | | | |
|---|---|---|---|---|---|---|---|---|
| 32 | F22 | F14 | F13 | G08 | G02 | E17 | H12 | H09 | H00 |
| 31 | F19 | F16 | F12 | G04 | F01 | E19 | E12 | E05 | E01 |
| 30 | G23 | F17 | G09 | G05 | F02 | E18 | E13 | H10 | H01 |
| 29 | F23 | I3 | G10 | F07 | E21 | H19 | H11 | E07 | E02 |
| 28 | I4 | G16 | G13 | F04 | E23 | H20 | H15 | E09 | H04 |
| 27 | F21 | G14 | F08 | F03 | H23 | H18 | H14 | H08 | E04 |
| 26 | G22 | G17 | G11 | F05 | E22 | E17 | E11 | E08 | E03 |
| 25 | G20 | G18 | F11 | G03 | F01 | H21 | H13 | H06 | E00 |
| 24 | F22 | F18 | F09 | G05 | G02 | E16 | E14 | E06 | I5 |
| 23 | G19 | F15 | G10 | G04 | F00 | E20 | E15 | H07 | H01 |
| 22 | F20 | G16 | G09 | G08 | H22 | H17 | E10 | E07 | E01 |
| 21 | F21 | I3 | F12 | G07 | G00 | H16 | H15 | H10 | I5 |
| 20 | I4 | F17 | F13 | F06 | G01 | H18 | H11 | H07 | H03 |
| 19 | F23 | F16 | F10 | G06 | E22 | H20 | E10 | H09 | H02 |
| 18 | G23 | F14 | G12 | G03 | H23 | H16 | E12 | H05 | H00 |
| 17 | F19 | G15 | F09 | F05 | G01 | E18 | H12 | E05 | E00 |

Fig. 19A

Key to Fig. 19

| Fig. 19A | Fig. 19B |
|---|---|
| Fig. 19C | Fig. 19D |

| PLB Input Lines | Multiplexer Input Lines | | | | | | | |
|---|---|---|---|---|---|---|---|---|
| 32 | D03 | A05 | D13 | A21 | A22 | C04 | B11 | C17 | C21 |
| 31 | D00 | A09 | A12 | D17 | D23 | B06 | C08 | B14 | C22 |
| 30 | A03 | A10 | A13 | D16 | C02 | B07 | C11 | B17 | C20 |
| 29 | A01 | A06 | A14 | D20 | B01 | C07 | C13 | C17 | B22 |
| 28 | D04 | A08 | A11 | A20 | A23 | B08 | C08 | B15 | B20 |
| 27 | D02 | A07 | D12 | A18 | C00 | B07 | C10 | C15 | B23 |
| 26 | D01 | D06 | A15 | A17 | B01 | C06 | B09 | C16 | B19 |
| 25 | A04 | A05 | D14 | A20 | C01 | B04 | B13 | B18 | B21 |
| 24 | D00 | D08 | D12 | A19 | D22 | B03 | B11 | B16 | I0 |
| 23 | D03 | D06 | D15 | D18 | B02 | B06 | B10 | C14 | C19 |
| 22 | A04 | D05 | D10 | A16 | C02 | C04 | C09 | C18 | C23 |
| 21 | A02 | D07 | D11 | D20 | D23 | C03 | B12 | I1 | B20 |
| 20 | I2 | D09 | A11 | D16 | A22 | C05 | C12 | C15 | B22 |
| 19 | A00 | A07 | A14 | D17 | B00 | B05 | B09 | B15 | B23 |
| 18 | D01 | A08 | A13 | A21 | D21 | B04 | C10 | C16 | C22 |
| 17 | D02 | A06 | A12 | D19 | D22 | C06 | B13 | B17 | C21 |

Fig. 19B

PLB Input Lines | | | | Multiplexer Input Lines | | | | |
---|---|---|---|---|---|---|---|---
16 | G21 | F15 | F11 | G06 | E21 | E19 | E13 | E06 | E03
15 | F20 | F18 | G12 | F04 | F02 | H19 | E15 | H06 | E04
14 | G19 | G15 | F08 | F07 | E23 | H17 | E14 | E08 | H04
13 | G21 | G17 | G13 | F03 | G00 | E20 | H13 | H08 | E02
12 | G20 | G14 | G11 | F06 | H22 | E16 | E11 | E09 | H02
11 | G22 | G18 | F10 | G07 | F00 | H21 | H14 | H05 | H03
10 | G22 | G14 | G13 | F07 | F02 | E19 | H12 | H05 | H02
09 | G20 | G17 | F08 | F04 | E21 | E18 | E12 | H09 | H03
08 | F22 | G18 | G11 | F03 | E23 | H19 | E13 | E05 | H00
07 | G19 | F18 | F11 | F05 | H23 | H20 | H11 | H10 | E01
06 | F20 | F15 | F09 | G03 | E22 | H18 | H15 | E07 | H01
05 | F21 | G16 | G10 | G05 | F01 | E17 | H14 | E09 | E02
04 | I4 | I3 | G09 | G04 | G02 | H21 | E11 | H08 | H04
03 | F23 | F17 | F12 | G08 | F00 | E16 | H13 | E08 | E04
02 | G23 | F16 | F13 | G07 | H22 | E20 | E14 | H06 | E03
01 | F19 | F14 | F10 | F06 | G00 | H17 | E15 | E06 | E00
00 | G21 | G15 | G12 | G06 | G01 | H16 | E10 | H07 | I5

Fig. 19C

| PLB Input Lines | Multiplexer Input Lines | | | | | | | |
|---|---|---|---|---|---|---|---|---|
| 16 | D04 | A10 | D13 | D18 | C01 | B03 | C13 | B14 | C23 |
| 15 | A01 | A09 | D10 | A19 | B02 | B08 | C11 | I1 | C19 |
| 14 | A03 | D07 | D15 | A16 | C00 | C07 | C12 | C18 | I0 |
| 13 | I2 | D05 | D11 | A17 | A23 | B05 | B12 | C14 | B21 |
| 12 | A02 | D09 | D14 | A18 | D21 | C05 | C09 | B16 | B19 |
| 11 | A00 | D08 | A15 | D19 | B00 | C03 | B10 | B18 | C20 |
| 10 | I2 | D07 | D10 | D18 | D22 | B04 | B09 | C15 | B20 |
| 09 | A02 | D05 | D15 | A19 | C01 | C06 | C10 | B15 | B22 |
| 08 | A00 | D09 | D11 | A16 | B02 | B03 | B13 | C16 | B23 |
| 07 | D03 | D08 | D14 | A17 | C00 | B08 | C13 | B17 | C22 |
| 06 | D00 | A05 | A15 | A18 | A23 | C07 | C11 | B14 | C21 |
| 05 | A03 | A09 | D13 | D19 | D21 | B05 | C13 | I1 | C23 |
| 04 | A01 | A10 | A12 | A21 | B00 | C05 | B12 | C18 | C19 |
| 03 | D04 | A06 | A13 | D17 | A22 | C03 | C09 | C14 | I0 |
| 02 | D02 | A08 | A14 | D16 | D23 | C04 | B10 | B16 | B21 |
| 01 | D01 | A07 | A11 | D20 | C02 | B06 | B11 | B18 | B19 |
| 00 | A04 | D06 | D12 | A20 | B01 | B07 | C08 | C17 | C20 |

Fig. 19D

MULTIPLE ARRAY PROGRAMMABLE LOGIC DEVICE WITH A PLURALITY OF PROGRAMMABLE SWITCH MATRICES

This application is a continuation of application Ser. No. 07/924,267, filed Aug. 3, 1992, now abandoned.

BACKGROUND OF THE INVENTION

1. Field of the Invention

This invention relates generally to programmable logic devices and more specifically to an architecture for programmable logic devices that is scalable from a low density to a very high density and that includes an input switch matrix, an output switch matrix, and a centralized switch matrix, and provides a fixed, predictable, and deterministic signal propagation time delay.

2. Description of Related Art

A wide variety of PLDs are available for low and medium density logic applications. The main features differentiating the PLDs are speed performance, density, logic flexibility, software complexity required for mapping a user design to the PLD, and effective utilization of resources. Unfortunately, the architecture of many PLDs is not easily scalable to very high densities without sacrificing speed. Typically, each PLD includes a programmable logic array that generates product terms and each macrocell in the PLD is driven by a set of the product terms. The output signal from the macrocell drives a pin of the PLD.

Some PLDs utilize an expander array of product terms to facilitate logic flexibility. Conceptually, the expander array approach attempts to solve product term array logic efficiency with a combination of a "fixed number of product terms" from a logic array and an "allocatable number of product terms" from the expander array. In one approach, each output macrocell has access to a minimum number of product terms from the logic array plus a variable number of product terms that can be borrowed from the expander array. The major advantage of this approach is logic flexibility, because each output macrocell can receive a large number of product terms from the expander array.

However, the expander array method has several major shortcomings. First, the expander array is implemented as either a NAND array or a NOR array. Output lines from the expander array feedback to the input lines of each logic array thereby increasing the number of logic array input lines significantly. Second, the expander array is driven from the same input lines as the input lines to the logic array. Hence, both the expander array and the logic array have a large number of input lines and as the number of product terms in the logic array increases, the number of input lines to both arrays increases.

As the number of input lines to a product term array increases, the silicon die size of the PLD increases and the speed performance of the PLD decreases. Consequently, the expander array approach increases product flexibility at the expense of both speed performance and die size. However, at some point, as the architecture is scaled to larger and larger densities, the array size becomes prohibitive as does the speed performance. Therefore, the application of the expander array concept to very high performance high density PLDs is questionable.

To alleviate software complexity and to facilitate signal routability, some PLDs include a full-cross point programmable interconnect array (PIA) to interconnect the programmable logic blocks in the PLD. The full crosspoint programmable interconnect array approach has the potential advantage of 100% global connectivity for all signals. All global signals are typically brought into a centralized interconnect array and the input signals for each programmable logic block in the PLD are generated from the centralized interconnect array.

Although the number of input signals for each programmable logic block is a subset of the total number of global signals, each input signal can essentially be a function of all global signal sources at the same time. This global connectivity provides 100% connectivity and somewhat simplifies the "Routing" software. Also, since full global connectivity is always available, the routing software is not required to make any particularly complex intelligent decisions for routing signals.

The major disadvantages of the centralized PIA approach are speed degradation, silicon die size, scalability with increased density, and wasting resources. A PLD incorporating a full cross-point programmable interconnect array tends to be (and is likely to be) slower and more expensive than a comparable PLD with a sparsely populated switch matrix. Since the PIA receives feedback signals from all the internal logic macrocells of all logic blocks and all I/O pin feedback signals, the number of input signals to the PIA is directly proportional to the total number and size of the logic blocks, and the number of I/O pins in the PLD. The size of the PIA increases almost exponentially with an increase in PLD density. Very large programmable interconnect arrays are inherently "slow" and have the additional overhead of larger die area.

Considering these limitations, it is not surprising that the PIA has been utilized primarily in smaller density PLDs or high density PLDs with low performance. As the density is increased to larger pin-count and higher-density logic, the PIA overhead becomes quite significant. While conceptually the same approach can be used for larger density devices, in reality the approach becomes very difficult to implement. Therefore, scalability to higher performance higher densities using the full crosspoint PIA approach is questionable.

The last but not the least significant drawback of the PIA is its potential wastage of significant resources. Since the PIA is a monolithic array, it tends to result in significant wastage of resources. The number of input signals needed are usually significantly smaller than the device's full capability. As a result, most of the signal paths remain unutilized.

An alternative to the PIA in segmented block based PLDs is the multiplexer based, sparse switch matrix structure. While the PIA approach strives for flexibility via a brute force approach of throwing silicon at the problem, the multiplexer based sparse switch matrix approach focuses on optimized routability, speed, and die size in a more intelligent manner. Two of the most important parameters for a multiplexer based switch matrix are the number of input lines to each programmable logic block from the switch matrix and the multiplexer size. As the multiplexer size and the number of programmable logic block input lines increase, signal routability increases. Unfortunately, both a larger number of input lines and a larger multiplexer structure also result in slower performance and bigger die sizes.

In a prior art device with a 15 nanosecond (ns) pin-to-pin signal delay, twenty-two to twenty-six programmable logic block input lines and a 16:1 multiplexer based switch matrix were adequate for gate densities up to 3,000 to 3,600 gate equivalents. Twenty-six input lines and a 16:1 multiplexer provide the ability to select the twenty-six programmable logic block input signals from a maximum of 416 different signals.

For higher density PLDs with a sparse switch matrix, each signal had at least 2.5 ways to enter each programmable logic block. For a maximum of 416 different signals and 2.5 ways of routability for each different signal, the number of different input signals is limited to about 152 signals (i.e., 416/2.5).

If the PLD has more than this number of signals, signals must be judiciously selected and routed to achieve "optimal global" connectivity. However, with only a routability factor of 2.5, as the density of the PLD increases signal routing becomes increasingly more difficult.

The major advantage of this single tiered multiplexer-based switch matrix structure (up to certain number of input lines and multiplexer size) is speed and die size. The signal propagation delay through a 16:1 multiplexer, depending on the implementation, is typically about 1 to 2 nanoseconds (ns). This delay is always fixed and depending upon the structure of the switch matrix can be the same for all signals. Further, since all the signals always pass through the switch matrix in a similar manner, the timing delay calculation is relatively simple and straight forward.

While simplicity, speed, and smaller die size are the major advantages of the multiplexer based switch matrix structure, the limitations can be programmable logic block input lines and multiplexer size. Input lines and multiplexer size limitations are related to the density or pin-count of the PLD. A programmable logic block with twenty-six input lines and 16:1 multiplexer for each input line is adequate for a density up to 3,600 gates in a 84-pin package. As the pin-count or the logic density is increased, providing optimal global connectivity with the limitation of twenty-six input lines and a 16:1 multiplexer is difficult. Consequently, a multiplexer-based single tier single switch matrix by itself is also limited in scalability to higher densities.

Another significant problem with the higher density PLDs is associated with the use of the PLD on a circuit board. Typically, the user logic design is programmed into the PLD and a specific signal pin-out for the PLD is obtained. This signal pin-out is used to lay out the circuit board. Frequently, in the testing of the circuit board, it is discovered that the PLD must be reprogrammed to accommodate design changes.

In reprogramming the PLD, assuring that signal pin-out does not change is often quite difficult. Thus, reprogramming the PLD may mean starting over with the circuit board design. This delays development and increases development costs significantly. Thus, the architectures of prior art PLDs are not sufficiently flexible once a signal pin-out for the PLD is established.

SUMMARY OF THE INVENTION

The programmable logic device (PLD) of this invention includes two or more programmable logic blocks interconnected by a programmable switch matrix that includes a programmable input switch matrix (input switch matrix) and a programmable centralized switch matrix (centralized switch matrix). Each programmable logic block receives input signals only from the combination of the centralized switch matrix, which is sometimes referred to as a "programmable centralized switch interconnection means, and the input switch matrix."

The output signals from a programmable logic block are coupled to a plurality of input/output (I/O) pins by an output switch matrix, i.e., a programmable output switch interconnection means. The output signals from the programmable logic block are also fed directly to the programmable input switch matrix. In addition, an input macrocell couples the signal on an I/O pin driving the input macrocell, i.e., the associated I/O pin, to the programmable input switch matrix.

The programmable input switch matrix of this invention provides a uniform treatment of all feedback signals to the programmable centralized switch matrix and thereby (i) simplifies signal routing, (ii) provides an improved functionality balance, and (iii) improves resource utilization within the PLD in comparison to the prior art PLDs with a plurality of programmable logic blocks interconnected only with a global programmable switch matrix. The improvement in routability is significant because the enhanced routability facilitates migration of the architecture of this invention to higher density PLDs without compromises in signal availability.

Specifically, the input switch matrix, in one embodiment, provides an equal number of signal paths for each feedback signal to the centralized switch matrix. In another embodiment, each feedback signal entering the input switch matrix has an equal chance of passing therethrough to the centralized switch matrix. Here "a feedback signal" is an input signal to the input switch matrix. In one embodiment, the feedback signals and I/O pin signals for a programmable logic block drive a plurality of input lines of a bank of the input switch matrix. The input switch matrix bank selectively connects and disconnects the plurality of input lines to the output lines of the input switch matrix.

An important aspect of the invention is that each feedback signal passes through the input switch matrix to reach the centralized switch matrix. Thus, unlike prior art PLDs, where each feedback signal had only one path to a global switch matrix, the multiple paths or multiple chances for each signal provides the enhanced signal routability described above.

Also, each feedback signal is treated uniformly whether the signal is an input signal from an I/O pin or a feedback signal from the programmable logic block and whether the programmable logic block feedback signal is from a buried logic macrocell or an output logic macrocell. The signal propagation time delay for each signal passed through the input switch matrix is a fixed deterministic and predictable time delay. Yet another advantage of the input switch matrix of this invention in combination with the centralized switch matrix is a reduction in the total number of input signals to the centralized switch matrix. In one embodiment, the input switch matrix bank for a programmable logic block provides twenty-four input signals for the centralized switch matrix from a total of thirty-two signals.

The output switch matrix of this invention eliminates many of the shortcomings of prior art high density PLDs. The output switch matrix has a fixed, predictable, deterministic, and path independent signal propagation time delay for each signal passed therethrough. The output switch matrix selectively routes a logic macrocell output signal to one I/O pin in a multiplicity of I/O pins. In one embodiment, the output switch matrix has one bank for each programmable logic block in the PLD. For each I/O pin coupled to the bank, the bank couples and decouples a plurality of output signals from the programmable logic block to the I/O pin. Therefore, output signals are easily routed to any I/O pin even after a pin-out for the PLD has been established and it is necessary to reprogram the PLD. Therefore, with the PLD of this invention, it is no longer necessary to modify a circuit board design that uses the PLD when the PLD is reprogrammed.

The output switch matrix also improves the functional symmetry of the PLD and thereby enhances the functionality of the PLD without requiring additional resources within the programmable logic block. Specifically, in one embodiment, the number of product terms within the programmable logic block is not the same for all the I/O pins. However, if product term symmetry is required at a particular set of I/O pins that normally includes an I/O pin with access to a different number of product terms than the other pins in the set, the output switch matrix permits routing of a signal from an I/O pin with the required number of product terms to the I/O pin that would normally have the different number of product terms. Thus, the user design is no longer constricted by the limitations imposed on the PLD to support a certain speed specification for example.

The output switch matrix and the input switch matrix decouple the programmable logic block and centralized switch matrix from the pin-out and the feedback architecture of the PLD. Thus, the output switch matrix and the input switch matrix can be effectively used with a wide variety of programmable interconnect structures and programmable logic block architectures to achieve the enhanced resource utilization, routability and functionality provided by the principles of this invention.

The centralized switch matrix provides optimal global connectivity for all signals including dedicated input signals, programmable logic block feedback signals, and signals from I/O pins. Each programmable logic block has accessibility to all these global signals from the centralized switch matrix. The centralized switch matrix has a fixed, predictable, uniform, deterministic, and path independent signal propagation time delay for each signal that traverses the centralized switch matrix. Since each programmable logic block receives input signals only from the centralized switch matrix, the uniform treatment of all signals by the centralized switch matrix is a key aspect in obtaining a fixed predictable, uniform, deterministic signal propagation time delay from pin-to-pin of the PLD.

Thus, the high speed switch matrix of this invention that includes the centralized switch matrix and the input switch matrix provides a fixed, uniform, predictable and path independent time delay for all signals that are passed through the centralized switch matrix and the input switch matrix. Further, since the programmable logic array only receives signals from the centralized switch matrix, the centralized switch matrix effectively decouples the programmable logic block input lines from the programmable logic macrocells. Moreover, the output switch matrix decouples the logic macrocells in the programmable logic block from the input/output pins. Therefore, the differentiation between buried logic macrocells and output logic macrocells is no longer important because the output switch matrix selectively couples and decouples a plurality of logic macrocells in the programmable logic block to a particular I/O pin. This alleviates problems in the software used to map a user design to the PLD of this invention. The high speed switch matrices of this invention maintain all the advantages of the prior art limited connectivity switch matrices while at the same time providing enhanced signal availability and routability.

BRIEF DESCRIPTION OF THE DRAWINGS

FIG. 8 is a block diagram that illustrates the operation of the logic allocator of this invention.

FIG. 18 is a key to FIGS. 18A–18D which are an illustration of one embodiment of input signal configuration for the centralized switch matrix of this invention.

FIG. 19 is a key to FIGS. 18A–18D which are an illustration of another embodiment of input signal configuration for the centralized switch matrix of this invention.

DETAILED DESCRIPTION

Figure 1:
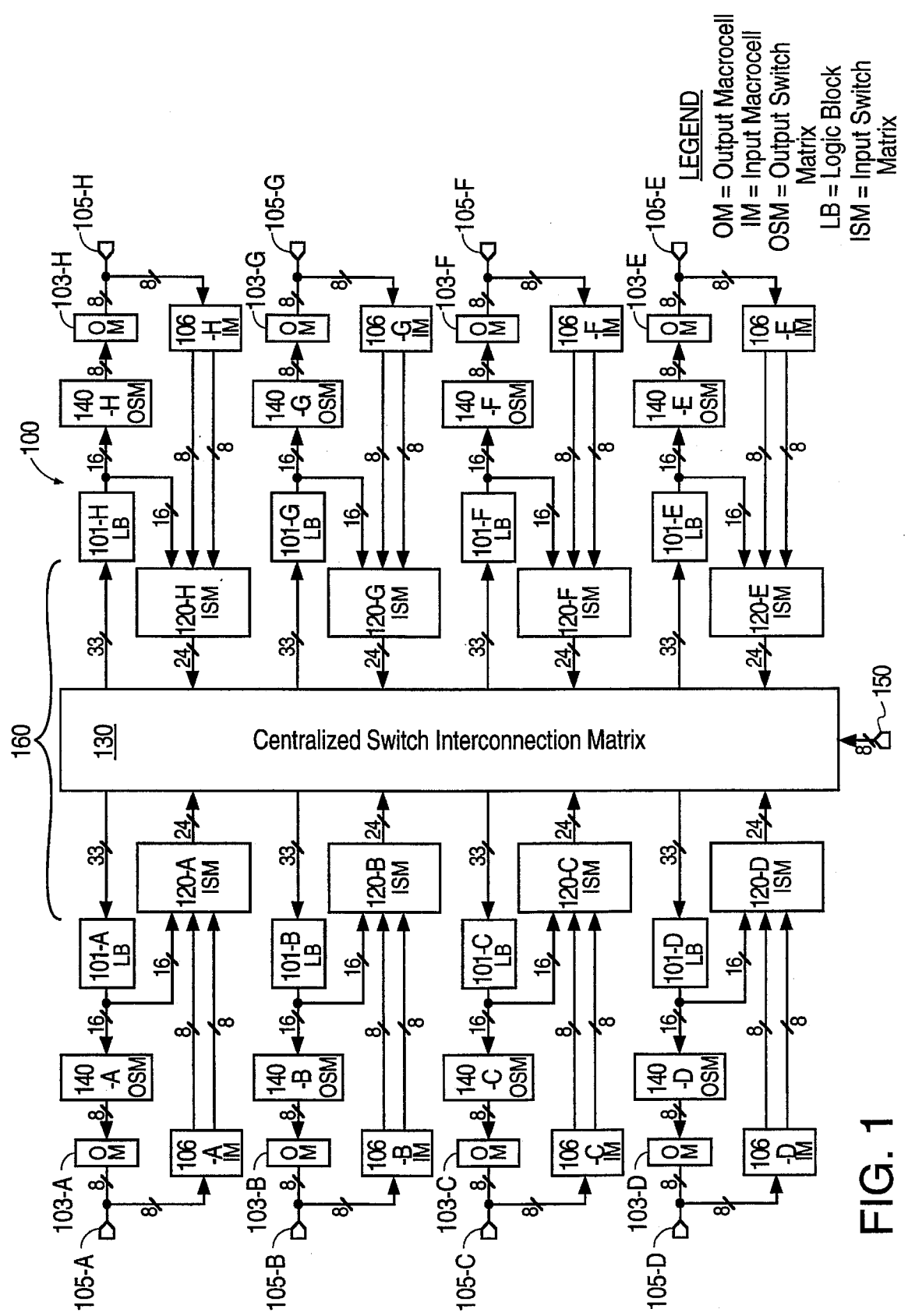
FIG. 1 is a block diagram of one embodiment of a very high density PLD of this invention with a plurality of identical programmable logic blocks interconnected by a programmable switch matrix that includes a programmable centralized switch matrix and a programmable input switch matrix.

In accordance with the principles of this invention, a very high density programmable logic device (PLD) includes a plurality of programmable switch matrices interconnecting a plurality of programmable logic blocks. As explained more completely below, the plurality of programmable switch matrices provide improved decoupling of the programmable logic blocks from the input/output pins over prior art PLDS. Further, the plurality of programmable switch matrices provide a true fixed, predictable, and deterministic pin-to-pin signal propagation delay as the PLD is scaled to higher densities.

In one embodiment, electrically programmable logic device PLD 100 (FIG. 1) of this invention includes a plurality of preferably identical programmable logic blocks 101-A to 101-H arranged in an array, preferably a symmetrical array, about a programmable centralized switch matrix 130 and a programmable input switch matrix 120 with banks 120-A to 120-H. Programmable logic blocks 101-A to 101-H are interconnected through programmable centralized switch matrix 130 (centralized switch matrix 130). Programmable logic blocks 101-A to 101-H preferably communicate with each other only through the combination of centralized switch matrix 130 and input switch matrix 120 and preferably receive all input signals from centralized switch matrix 130. As explained more completely below, PLD 100 can function as eight independent PLDs or alternately as one or more monolithic PLDs.

The signals generated by programmable logic blocks 101-A to 101-H in response to input signals from centralized switch matrix 130 are provided to a programmable output switch matrix 140 that includes banks 140-A to 140-H. Each output line of a programmable logic block is connected to programmable output switch matrix 140 (output switch matrix 140). Output switch matrix 140 programmably connects and disconnects the signals from the programmable logic block to a plurality of input/output cells. Specifically, each bank 140-A to 140-H of output switch matrix 140 drives a plurality of input/output (I/O) cells 103-A to 103-H, respectively. Each I/O cell selectively couples and decouples a signal from output switch matrix 140 to one I/O pin in the plurality of I/O pins 105. Therefore, the output lines of output switch matrix 140 are coupled to I/O pins 105. As explained more completely below, each I/O pin of PLD 100 may function as an output pin only, an input pin only, or as both an input pin and an output pin.

Output switch matrix 140 is one of the key aspects of this invention. Output switch matrix 140 programmably couples and decouples programmable logic blocks 101-A to 101-H from input/output (I/O) pins 105-A to 105-H, respectively. Further, each bank of output switch matrix 140 provides programmable connectivity between the programmable logic block output signals driving the bank and the I/O pins coupled to the bank. As explained more completely below, this programmable connectivity eliminates the distinction between buried logic macrocells and output logic macrocells within the programmable logic block of the prior art PLDs.

Each I/O pin of PLD 100 is connected to an input macrocell in a plurality of input macrocells 106. Specifically, each plurality of I/O pins 105-A to 105-H is connected to a plurality of input macrocells 106-A to 106-H, respectively. Each bank of input macrocells 106-A to 106-H drives the corresponding bank 120-A to 120-H of input switch matrix 120. In this embodiment, each plurality of input macrocells 106 provides a first plurality and a second plurality of signals to the corresponding bank of input switch matrix 120.

In addition to the two pluralities of signals from input macrocells 106, each bank of input switch matrix 120 is also connected to the programmable logic block output lines. Hence, each bank of input switch matrix 120 has access to all the programmable logic block output signals and all the signals on the I/O pins associated with the programmable logic block. Generally, the entire group of input signals to input switch matrix 120 are referred to as "feedback signals".

Herein, a reference to "a corresponding component" or "an associated component" refers to the components have the same alphanumeric character following the reference numeral in the drawings. For example, programmable logic block 101-A, output switch matrix 140-A, I/O cells 103-A, I/O pins 105-A, input macrocells 106-A, and bank 120-A of input switch matrix 120 are associated components.

In prior art PLDs with a global switch matrix, the feedback signals from some logic macrocells were permanently connected to the global switch matrix input lines. Further, local feedback signals and global feedback signals had different routes to the global switch matrix and consequently different delay times. Both of these features introduced additional complexity in the software used to program the PLD and different time delays as the PLD architecture was scaled to higher densities.

Input switch matrix 120 eliminates the fixed connectivity of the feedback signals to global switch matrix 130 and provides a uniform time delay treatment for all feedback signals. Moreover, input switch matrix 120 provides enhanced signal routability for each feedback signal in comparison to the prior art PLDs.

Centralized switch matrix 130 is a means for selecting input signals for each programmable logic block 101-A to 101-H. Centralized switch matrix 130 can route signals from one programmable logic block to another programmable logic block (block), signals from dedicated input pins 150 to a block or blocks and a signal from a block back to that block. Signal transfer through centralized switch matrix 130 is very rapid and signal path flexibility through centralized switch matrix 130 for each programmable logic block 101 provides numerous combinations of input signals, as described more completely below. Also, centralized switch matrix 130 provides a fixed, path independent, uniform, predictable and deterministic time delay for all signals routed through centralized switch matrix 130.

In one embodiment, the three switch matrices of this invention are implemented using programmable multiplexers. As described more completely below, multiple configurations of these switch matrices are feasible using programmable multiplexers. The number of multiplexers and size of each multiplexer is a tradeoff between the size of the die, silicon utilization, and speed performance. A preferred embodiment is described below and in view of this discussion other embodiments will be apparent to those skilled in the art.

An important aspect of this invention is the fixed number of input lines to each programmable logic block 101 from centralized switch matrix 130. As described more completely below, this feature maintains the speed performance of PLD 100 as the input/output capability is increased and this feature enhances the designer's ability to migrate a design to other devices having the architecture of this invention.

In one embodiment of this invention, programmable logic device 100 is completely symmetric. Each of programmable logic blocks 101-A to 101-H in PLD 100 is identical. The symmetry simplifies the development of the silicon die by the silicon chip designer and the design of a system using the PLD of this invention by the system designer. Also, without the inherent symmetry, the development of software tools for PLD 100 is more difficult.

PLD 100 is only illustrative of the general architecture of the PLDs of this invention and is not intended to limit the invention to the embodiment shown. A multiplicity of programmable logic blocks may be interconnected, as illustrated in FIG. 1, using the centralized switch matrix, the input switch matrix, and the output switch matrix of this invention.

Thus, a family of PLDs can be created with the architecture of this invention with varying degrees of logic capability that includes a gate density of up to 10,000+ gates. The PLDs in the family of PLDs include a range of (i) 96 to 256 macrocells, (ii) 144 to 384 individually programmably configurable registers/latches ("register/latch" means the programmable element is configurable as one of a register and a latch), and (iii) 544 to 1400+ products terms. The PLDs in the family of PLDs are packaged in PLCC and fine-pitched PQFP packages having from 68 to 196+ pins that include 48 to 128 input/output pins.

The PLD architecture of this invention achieves enhanced logic capability at higher gate densities while maintaining high speed performance relative to prior art high density PLDs. Each PLD in the family of PLDs of this invention has real, fast, fixed, predictable, deterministic and path independent signal propagation time delays from pin-to-pin of the PLD. Specifically, the pin-to-pin signal propagation time delay is about 15 to 20 nanoseconds, and preferably about 15 nanoseconds even for the highest density PLD. With these fast, fixed and predictable timing characteristics, the family of PLDs of this invention is from two to four times faster than prior art field programmable gate arrays with comparable gate densities. Of course, the PLD of this invention can function as a wide field programmable gate array. However, unlike prior art high density field programmable gate arrays, when the PLD of this invention is used as a field programmable gate array, the pin to pin time-delay is the fast, fixed predictable deterministic path independent time-delay described above.

The PLDs in the family of PLDS are implemented using 0.65 micron double metal CMOS electrically erasable technology. Each PLD is 100% testable. For PLDs in PQFP packages with preferably more than 84 pins, the PLDs are five volt in-circuit programmable with built in IEEE 1149.1 JTAG compatibility. A single set of dedicated pins are used for both in-circuit programming and JTAG compatibility.

Figure 2:
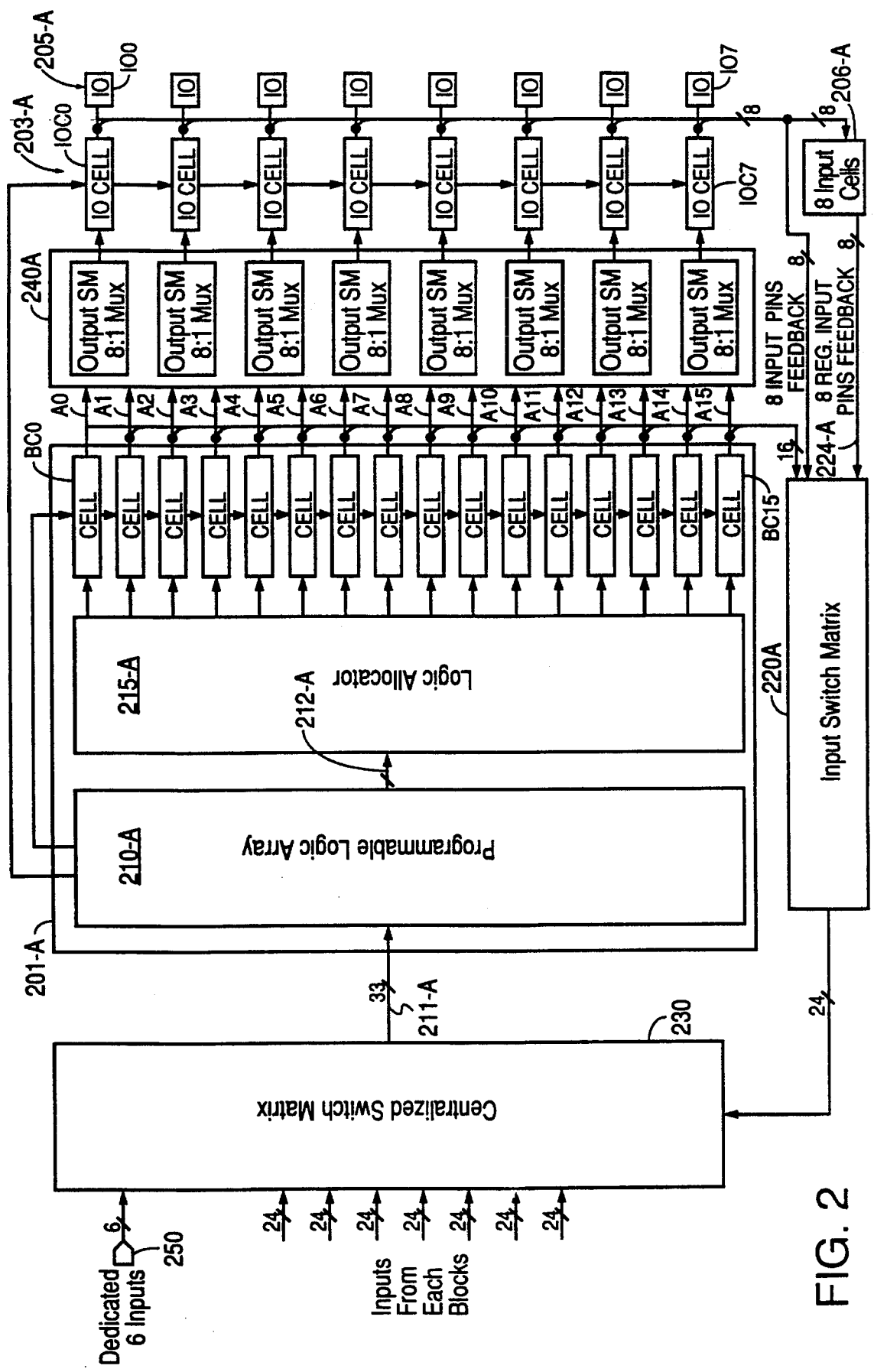
FIG. 2 is a more detailed block diagram of the basic building of this invention that includes a programmable logic block, programmable input switch matrix bank, programmable output switch matrix bank, I/O cells input macrocells, and I/O pins of this invention.

A basic building block for the PLDs of this invention is shown in more detail in FIG. 2. In FIG. 2, the block of components of PLD 100 (FIG. 1) which include the alpha-numeric character "A" are illustrated. However, in view of symmetry of PLD 100 and the fact that each block of components of PLD 100 are identical, the structure illustrated in FIG. 2 is representative of each block of components in PLD 100 with the same alphanumeric character in the reference numeral as well as each block in each PLD in the family of PLDs.

Programmable logic block 201-A includes a programmable logic array 210-A, a programmable logic allocator 215-A, and a plurality of programmable logic macrocells BC0 to BC15. I/O cells 203-A include a plurality of I/O cells IOC0 to IOC7 while input macrocells 206-A include a plurality of input macrocells INC0 to INC7 (not shown). I/O pins 205-A include I/O pins IO0 to IO7.

Programmable logic block 201-A receives a plurality of input signals, e.g. up to 33 input signals in this embodiment, from centralized switch matrix 230. As explained more completely below, the input signals may be selected from (i) signals from other programmable logic blocks, (ii) signals from I/O pins 205-A, (iii) feedback signals from logic macrocells BC0 to BC15, or (iv) direct input signals from dedicated input pins 250. Hence, programmable logic block 201-A has four different sources of input signals and each of the four sources provides a plurality of signals. The configuration of centralized switch matrix 230 and the specific signals available to programmable logic block 201-A from each of the signal sources is described more completely below.

In one embodiment, programmable logic array 210-A is a programmable AND-fixed OR logic array(AND/OR array), i.e, a PAL structure. While PAL structure 210-A is described herein in terms of an AND/OR array, the AND/OR array is implemented in one embodiment as NOR.NOR logic with NAND.NAND arrays that are functionally equivalent to the AND/OR arrays described herein. Accordingly, the use of AND/OR array logic is illustrative only and is not intended to limit the scope of the invention.

Programmable logic block input lines 211-A from centralized switch matrix 230 provide the input signals to the programmable AND array in PAL structure 210-A. More importantly, PAL structure 210-A preferably receives all its input signals only from centralized switch matrix 230. Consequently, as the number of I/O pins, feedback lines, or dedicated input lines are changed, PAL structure 210-A is unaffected. Maintaining a fixed PAL structure with a fixed number of input lines helps to maintain the speed performance of the PLD as the density of the PLD is increased.

In one embodiment, each input signal and its complement are provided to the programmable AND array so that the programmable AND array has sixty-six input lines. The programmable AND array in PAL structure 210-A has a total of ninety product terms in this embodiment. The distribution of the product terms between control functions and logic functions varies depending on the embodiment of the PLD.

In one PLD, eighty product terms are available for logic functions and ten product terms are dedicated control product terms. The eighty logic product term are grouped into clusters of five product terms where four of the product terms have fixed availability to the cluster and one product term is programmably available to the cluster. In this embodiment, as described more completely below, the programmably available product term may be used either for macrocell signal polarity control or for logic. Each cluster of five product terms drives one OR gate in the fixed OR gate array of PAL structure 210-A. The sum of product terms from an OR gate drives one input line in the sixteen input lines 212-A, in this embodiment, of logic allocator 215-A.

The multiplicity of control product terms includes a first plurality of output enable control product terms and a second plurality of asynchronous control product terms. In one embodiment, as described more completely below, the plurality of product terms for asynchronous reset and asynchronous preset are provided to logic macrocells BC0 to BC15. The asynchronous reset and preset product terms are used to initialize programmable storage elements in the logic macrocells to which they are connected.

In another PLD, eighty product terms are available for logic functions and ten product terms are dedicated control product terms. In this embodiment, as described more completely below, the distribution of the eighty product terms depends on whether the logic is synchronous or asynchronous. The eighty logic product term are grouped in sixteen clusters of five product terms where two of the product terms in each cluster have fixed availability to the cluster and three product terms in each cluster are programmably available to the cluster. One of the three programmably available product terms may be used either for macrocell signal polarity control or for logic. The other two programmably available product terms may be used either for individual asynchronous reset/preset for a macrocell and for an individual clock for a macrocell, or for logic. Each product term cluster drives one OR gate in the fixed OR gate array of PAL structure 210-A. The sum of product terms from an OR gate drives one input line in the sixteen input lines 212-A, in this embodiment, of logic allocator 215-A.

The multiplicity of control product terms includes a first plurality of output enable control product terms and a second plurality of asynchronous control product terms. The configuration of the asynchronous control product terms relative to the programmably available individual asynchronous control product terms, in this embodiment, is described more completely below.

In each embodiment of this invention, the multiplicity of output enable product terms in the control product terms are connected to I/O macrocells 203-A. The configuration and use of the output enable product control terms are explained more completely below.

Logic allocator 215-A is programmable so that product terms from PAL structure 210-A are distributed to logic macrocells BC0 to BC15 as required by the user of the PLD of this invention. As explained more completely below, logic allocator 215-A of this invention includes a multiplicity of router elements wherein each router element steers a sum of a selected number of sum of product terms from PAL structure 210-A to a programmably selected logic macrocell. In one embodiment, the number of product terms available to a macrocell from the router element ranges from zero to twenty. Typically, the number of available product terms is not the same for each logic macrocell.

The number of product terms per router element may be selected in numerous ways. In this embodiment, the selected number of product terms is preferably four or five and there is one router element in logic allocator 230 for each logic macrocell. However, no router element is permanently connected to a logic macrocell. Logic allocator 215-A programmably couples and decouples PAL structure 210-A from logic macrocells BC0 to BC15.

Logic macrocells BC0 to BC15 configure the signals from logic allocator 215-A, as explained more completely below. Each logic macrocell provides an output signal to output switch matrix bank 240-A and a feedback signal to input switch matrix bank 220-A. Hence, in this embodiment, logic macrocells BC0 to BC15 are effectively both buried and output logic macrocells simultaneously because each logic macrocell is available for feedback logic functions and each logic macrocell can be connected to an I/O pin via output switch matrix bank 240-A. Each logic macrocell drives an input line of output switch matrix bank 240-A.

According to the principles of this invention, logic macrocells BC0 to BC15 are decoupled from centralized switch matrix 230 by input switch matrix bank 220-A and from PAL structure 210 by logic allocator 215. As the total number of logic macrocells in the PLD is increased, the programmable logic block structure and centralized switch matrix 230 are not proportionally affected. Therefore, unlike the prior art devices, PAL structure 210-A of this invention does not degrade speed performance as the density of the programmable logic macrocells is increased.

In fact, as the programmable logic macrocell density is increased, the pin-to-pin signal propagation delay time remains about constant because output switch matrix bank 240-A, input switch matrix bank 220-A and centralized switch matrix 230 provide a fixed known delay, and the number of input lines to the PAL structure is maintained. Therefore, the pin-to-pin time delay of the PLD remains relatively constant. Thus, a design implemented with one PLD of this invention is potentially scalable to a higher density PLD having more logic macrocell capability.

Output lines A0 to A15 of programmable logic macrocells BC0 to BC15, respectively, drive output switch matrix bank 240-A and input switch matrix bank 220-A. Output switch matrix bank 240-A effectively decouples logic macrocells BC0 to BC15 from I/O pins 205-A. Also, output switch matrix bank 240-A programmably steers the output signal from a particular programmable logic macrocell to a particular I/O pin. This capability enhances the symmetry of programmable logic block 201-A without adding additional product terms.

Specifically, logic allocator 215-A does not support complete wrap-around. In prior art PLDs with a logic allocator that did not support complete wrap-around, some logic macrocells had access to a smaller number of product terms than other logic macrocells. See for example, U.S. Pat. No. 5,015,884, of Om P. Agrawal et al. entitled "Multiple Array High Performance Programmable Logic Device Family," which issued on May 14, 1991, and which is incorporated herein by reference in its entirety and the more detailed discussion below. In these prior art PLDs, this meant that some I/O pins had a fixed and different range of logic capability than the fixed range of logic capability for other I/O pins.

However, in the PLD of this invention, output switch matrix bank 240-A steers signals from programmable logic macrocells BC0 to BC15 to I/O pins 205-A so that a group of I/O pins 205-A may be configured to have the same logic capability independent of the relationship of the I/O pin to a logic macrocell that has a lesser logic capability. Hence, to the user application, the PLD appears to have better symmetry than the prior art PLDs because no I/O pin has a fixed logic capability.

In one embodiment, output switch matrix bank 240-A includes a plurality of programmable multiplexers, e.g., the programmable 8:1 multiplexers illustrated in FIG. 2, where each programmable multiplexer is a sub-bank of output switch matrix bank 240-A. Hence, in this embodiment, the output signal of any one of eight programmable logic macrocells may be programmably connected to an I/O cell. Consequently, output switch matrix 240-A can programmably connect and disconnect each program logic block output signal to an I/O pin. Thus, in this embodiment, output switch matrix bank 240-A receives sixteen input signals from logic macrocells BC0 to BC15 and provides 8 output signals to I/O pin IO0 to IO7. According to the principles of this invention output switch matrix bank 240-A provides at least three different routes and preferably at least four different routes through the output switch matrix bank for each input signal. Specifically, for the programmable 8:1 multiplexers, each signal has four input paths to output switch matrix bank 240-A.

I/O cells 203-A selectively deliver the output signals from output switch matrix bank 240-A to I/O pins 205-A. Input macrocells 206-A configure the signals from I/O pins 205-A prior to providing the signals over lines 224-A to input switch matrix bank 220-A. In this embodiment, each input macrocell provides one of a registered and a latched signal to input switch matrix bank 220-A. The signals on I/O pins 205-A are also routed directly to input switch matrix bank 220-A.

Input switch matrix bank 220-A receives sixteen signals from logic macrocells BC0 to BC15, eight signals from input macrocells 206-A, and eight signals from I/O pins 205-A. In this embodiment, input switch matrix bank 220-A provides 24 input signals to centralized switch matrix 230 from the thirty-two input signals. Since input switch matrix bank 220-A, according to the principles of this invention, provides at least three different chances to pass through input switch matrix bank 220-A for each input signal. In one embodiment, input switch matrix bank 220-A includes twenty-four programmable 4:1 multiplexers. ((((4 input lines/mux)×24 muxes)/(32 input signals))=3 input lines/input signal.) Thus, in this embodiment, each input signal not only has three chances, but also three routes through input switch matrix bank 220-A.

In another embodiment, described more completely below, input switch matrix bank 220-A includes twenty-four programmable 2:1 multiplexers. In this embodiment, each input signal has three chances of passing through input switch matrix bank 220-A.

Input switch matrix bank 220-A provides all feedback signals an equal number of chances to reach centralized switch matrix 230-A. Therefore, all feedback signals are processed uniformly in that the feedback signals have equal and multiple chances to reach centralized switch matrix 230. Further, all feedback signals see the same fixed, path independent time delay through input switch matrix bank 220-A. Input switch matrix bank 220-A increases logic utilization of the PLD by providing the equal number of multiple chances to enter centralized switch matrix 230 for all feedback signals. Further, signal routability is improved over prior art PLDs with only a centralized switch matrix because with the fixed connectivity to the prior art centralized switch matrix, some signals had only one chance to enter the centralized switch matrix. Signal routability is particularly important as the PLD architecture is scaled to higher densities.

Logic Allocator

Figure 3:
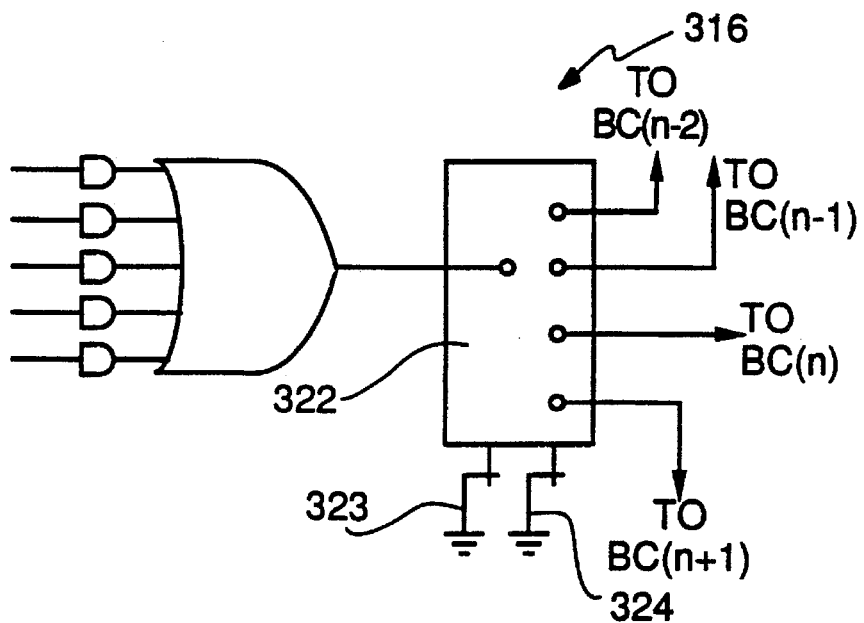
FIG. 3 is a diagram of a general demultiplexer in one embodiment of the logic allocator of this invention.

Logic allocator 215-A includes, in this embodiment, sixteen router elements 316 (FIG. 3). Each router element 316 includes a programmable one-to-four demultiplexer 322 which has a single input terminal and four output terminals. Architectural configuration cells 323, 324 are used to form a connection between the input terminal and only one of the four output terminals. The configuration of router elements described herein is illustrative only of a plurality of router elements with each router element steering a fixed number of product terms to a selected macrocell and is not intended to limit the invention to the specific configuration described.

The signal passed from the input terminal of demultiplexer 322 and the output terminal that receives the input signal is determined by the configuration of architectural cells 323 and 324. Thus, the programmable router element passes a selected signal therethrough to the output terminal in response to an input select signal. The possible values of the input select signal are determined by architectural cells 323 and 324, where n=0, 1, ..., 15. The configuration of demultiplexer 322 for one possible configuration of architectural cells 323 and 324 are given in Table 1. Of course, in FIG. 3 when a value for n is used and the number in the parentheses is negative, there is no connection to that output terminal of demultiplexer 322. The architectural cell values in Table 1 are illustrative only, and are not intended to limit the invention to the particular values shown.

TABLE 1

| Product Term Steering | | |
|---|---|---|
| Architectural Cell 323 | Architectural Cell 324 | Output Signal Supplied to Logic Macrocell |
| 0 | 0 | (n − 2) |
| 0 | 1 | n |
| 1 | 0 | (n + 1) |
| 1 | 1 | (n − 1) |

In Table 1, a zero corresponds to a logical zero and is equivalent to a programmed state and a one corresponds to a logical one and is equivalent to an unprogrammed or erased state.

Figure 4:
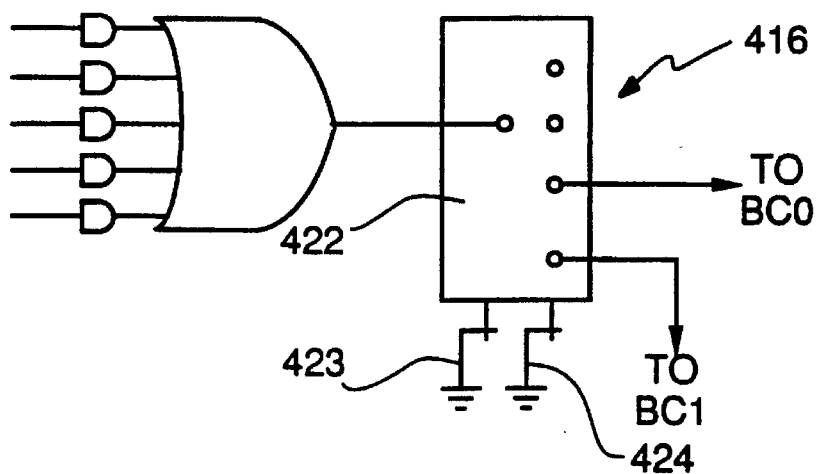
FIGS. 4, 5, 6, and 7 are diagrams of the demultiplexers in one embodiment of the logic allocator of this invention.
Figure 5:
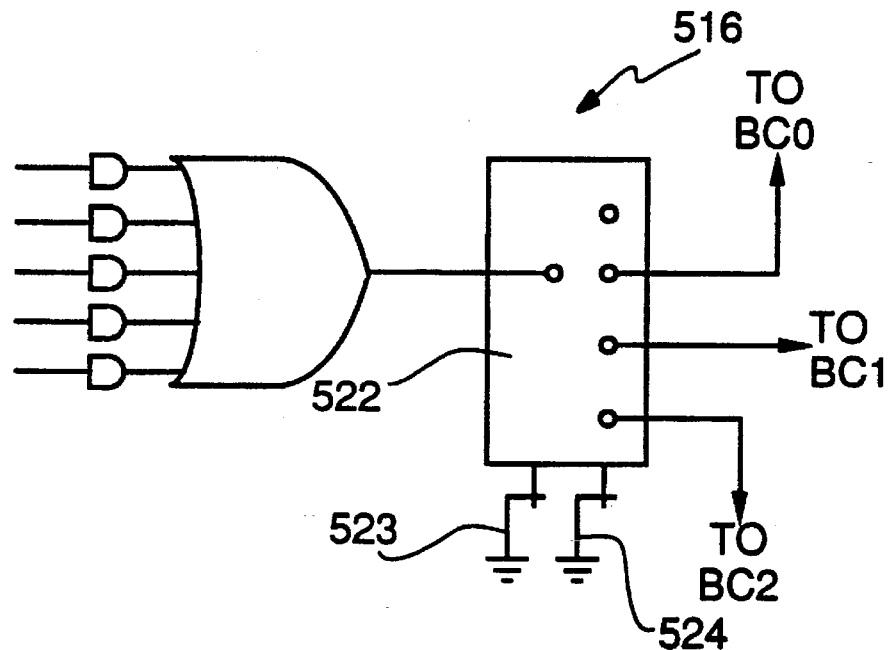
Figure 6:
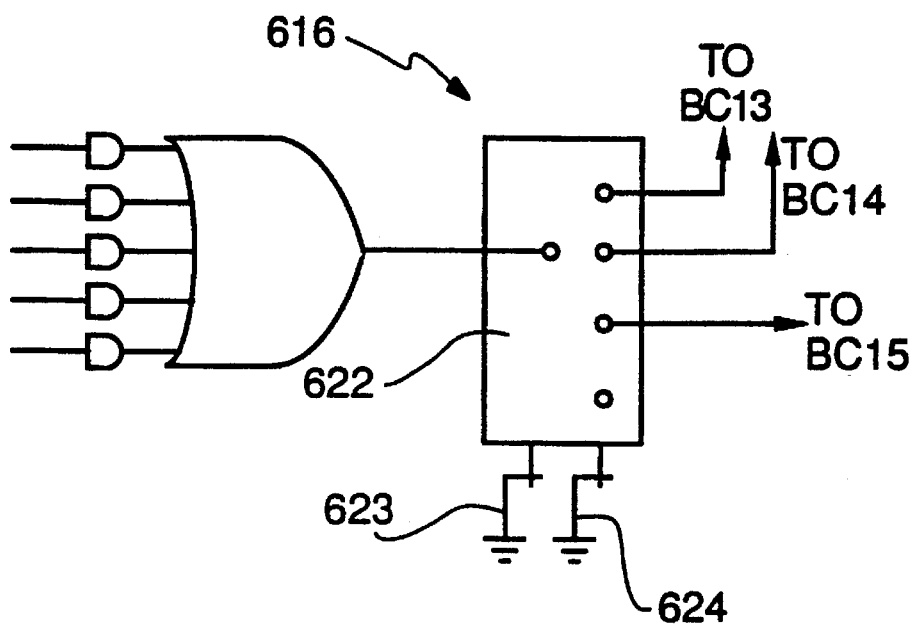

First router element 416 (FIG. 4) of logic allocator 215-A (FIG. 2) may provide a signal to either logic macrocell BC0 (FIG. 2), or logic macrocell BC1. Second router element 516 (FIG. 5) may provide a signal to either logic macrocell BC0 (FIG. 2), logic macrocell BC1, or logic macrocell BC2. Sixteenth router element 616 (FIG. 6) in logic allocator 215-A may provide a signal to logic macrocell BC13 (FIG. 2), logic macrocell BC14, or logic macrocell BC15. In this embodiment, the output lines from the router elements are input lines to a logic gate, e.g., an OR logic gate, and the output line of the logic gate is an input line to the logic macrocell specified e.g., in this embodiment, an input line to an XOR gate. See FIG. 9 for an example of a typical router element and the logic gate.

Figure 7:
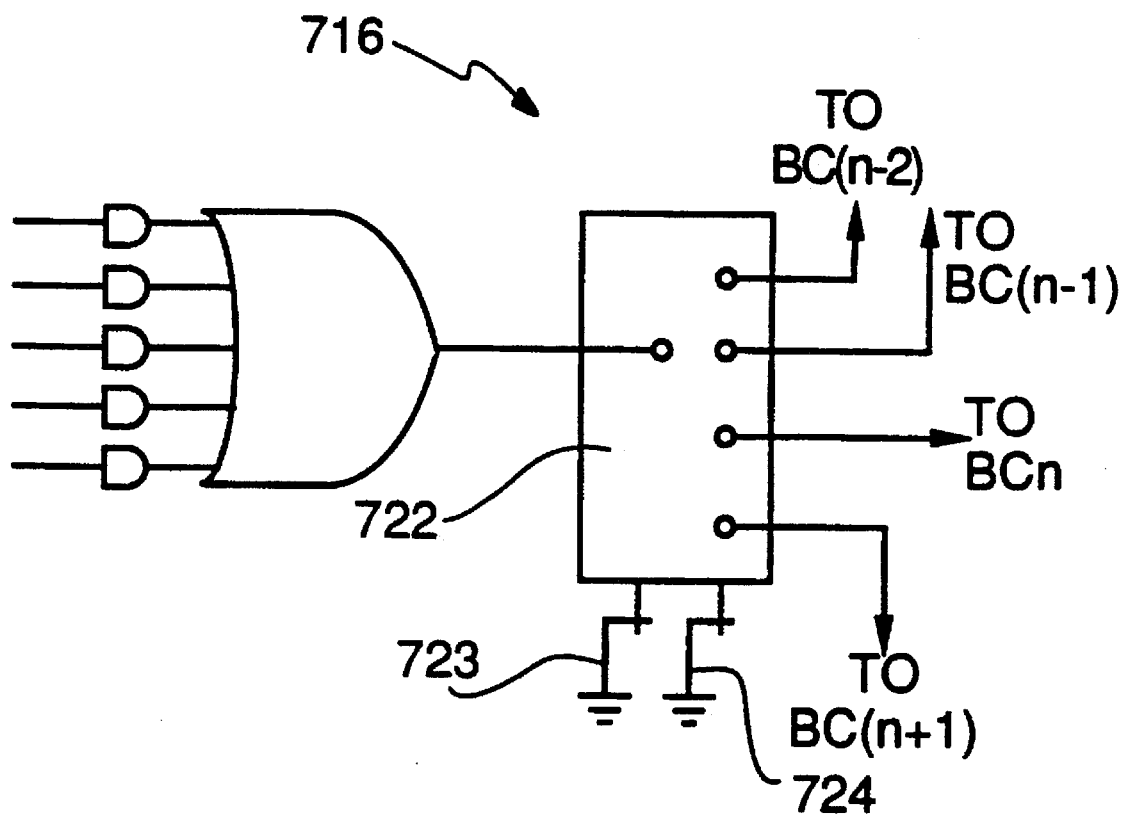

Each of the other thirteen router elements 716 (FIG. 7) in logic allocator 215-A (FIG. 2) may provide a signal to one of four logic macrocells. The four output lines from demultiplexer 716 are given as lines to macrocells BC(n−2), BC(n−1), BCn, and BC(n+1) where n=2, 4, ..., 14. Here, n represents the position of router element 716 in the column of router elements within logic allocator 215-A. The parenthesis are only for convenience and should be dropped after "n" is selected.

Thus, in this embodiment, logic macrocells BC0 and BC14 can receive up to a maximum of a sum of fifteen product terms while logic macrocells BC15 can receive up to a maximum of a sum of ten product terms. In this embodiment, complete wraparound at the ends of programmable logic block 201-A is not supported.

The operation of logic allocator 215-A is illustrated in FIG. 8. Boxes L0 through L15 on the left-hand side of the figure, each of which contains the numeral "5", represent the sum of product terms clump, each of which has five product terms, in PAL structure 210-A. On the right-hand side of FIG. 8 are boxes BC0 through BC15 where each box represents one of logic macrocells BC0 to BC15 (FIG. 2), respectively. The number within boxes BC0 to BC15 is the maximum number of product terms that logic allocator 215-A can route to that logic macrocell. The numbers within logic allocator 215-A represent the product terms as numbered on the left-hand side of the figure. Accordingly, FIG. 8 clearly illustrates the product term steering capability of logic allocator 215-A of this invention.

It is important to note that no product term resources are permanently allocated to a specific logic macrocell by logic allocator 215-A. Thus, in this embodiment, there are no wasted product terms associated with a logic macrocell when the logic macrocell is not utilized.

In another embodiment, PAL structure 210 includes an additional fifteen product terms over those described above. These additional product terms provide full wrap-around emulation so that in this embodiment, the logic allocator provides up to twenty product terms to each logic macrocell.

There are two fundamental types of macrocells in the PLD architecture of this invention, (i) logic macrocells and (ii) input macrocells. However, the configuration and function of the logic macrocells depends on the particular embodiment of the PLD. Recall as described above, in one embodiment, the programmable logic array has clusters of five product terms with one of the product terms programmably available to the cluster and in the other embodiment, the programmable logic array has clusters of five product terms with three of the products terms programmably available to the cluster. Hence, in the following description, the varying features of the programmable logic array are included with the logic macrocell description and so the logic macrocells are broken into a first and second embodiment. It should be noted that in both embodiments, similar components are included in the logic macrocells but the components are configured in different ways.

First Embodiment of Logic Macrocells

Figure 9A:
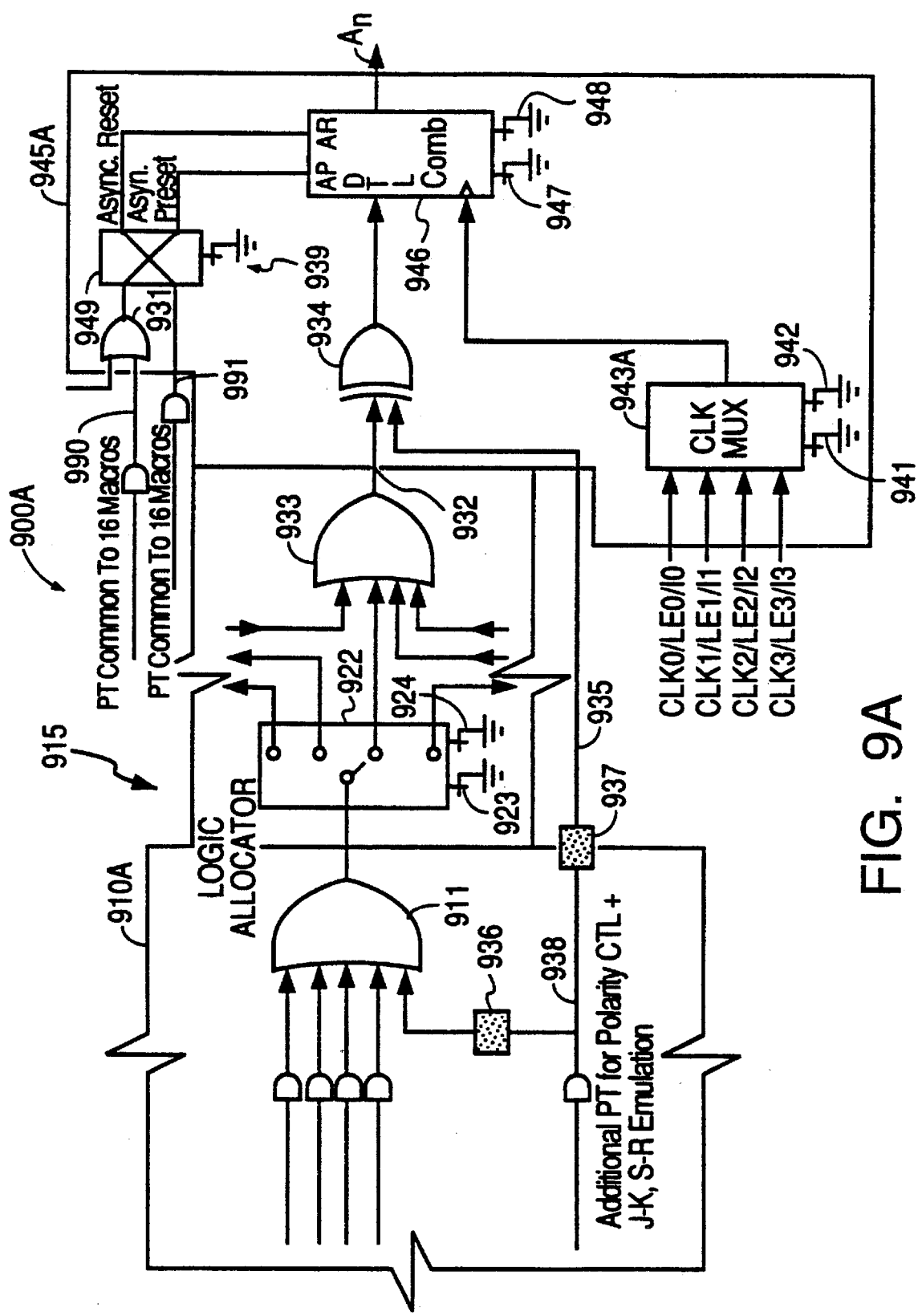
FIG. 9A is a detailed block diagram of one embodiment of the programmable logic block cell of this invention.

In this embodiment, each programmable logic block has eighty logic product terms that are grouped in sixteen clusters of five product terms. In each five product term cluster, one product term is programmably available to the cluster and the other four product terms are fixed to the cluster. FIG. 9A is a conceptual schematic diagram of a programmable logic block cell 900A that is used to construct the programmable logic block in this embodiment. Each cell 900A includes one of the sixteen product term clusters 910A in the programmable logic array, a router element 915 in the logic allocator, and a logic macrocell 945A. In addition, each cell 900A has access to two control product terms 990, 991 that are common to sixteen logic macrocells in the programmable logic block, i.e., a plurality of programmable logic macrocells, and are used for asynchronous preset and reset, as described more completely below. Logic macrocell 945A has programmable registered, combinatorial, or latched capability. If logic macrocell 945A is programmably configured as a register, a macrocell storage element is configured as one of an edge triggered D-type flip-flop, and a T-type flip-flop. Each logic macrocell 945A has individually programmable output signal polarity. Logic macrocell output signal "An" is always available to input switch matrix bank 220-A and to output switch matrix bank 240-A.

As illustrated in the embodiment in FIG. 9A, product term 938 drives a first programmable connection 936 and programmable polarity element 937. Programmable connection 936 programmably connects and disconnects product term 938 to OR gate 911. Thus, as described above, the cluster of product terms driving OR gate 911 is four fixed product terms with a fifth product term programmably available to the cluster.

Programmable connection 936 also programmably connects and disconnects product term 938 to programmable polarity control element 937. An architectural cell is used to configure programmable polarity control element 937 so that element 937 passes either the logic level of product term 938 to line 935 or the complement of the logic level of product term 938 to line 935 when product term 938 is steered to programmable polarity control element 937 by programmable connection 936. Therefore, programmable polarity control element 937 programmably configures product term 938 to a desired polarity, i.e., either active high or active low.

When product term 938 is steered to OR gate 911, polarity control element 937 is configured by the architectural cell to apply either a logic one signal or a logic zero signal on line 935 to exclusive OR gate 934.

The signal on line 935 drives a first input terminal of exclusive OR (XOR) gate 934. Output line 932 from OR gate 933 in logic allocator 915 is connected to a second input terminal of XOR gate 934. XOR gate 934 is also a polarity control means. If the signal on line 935 has a first logic value, the output signal of XOR gate 934 is active high and conversely, if the signal on line 935 has a second logic value, the output signal of XOR gate 934 is active low.

In another embodiment (not shown), a 2:1 programmable multiplexer with an inverting and a non-inverting input terminal is connected to the output line of the programmable logic element described below. The programmable multiplexer determines the polarity of the logic macrocell output signal. The tradeoff in selecting either the XOR gate or the programmable multiplexer as the polarity control means is between the silicon required for the multiplexer and the architectural cell and the inherent time delay of the multiplexer versus the additional silicon required for an additional product term and the XOR gate and the additional time delay associated with a larger product term array. The important aspect is that logic macrocell 945 includes a means for controlling the logic signal polarity.

The output signal of XOR gate 934 drives input terminal D/T/L/C of programmable logic element 946. Output terminal Q of programmable logic element 946 is connected directly to input switch matrix bank 220-A (FIG. 2) and to output switch matrix bank 240-A.

A first product term line 990 is connected to a first input terminal of OR gate 931. A second input terminal of OR gate 931 is driven by a power-up reset signal. The output signal of OR gate 931 is connected to a first input terminal of programmable signal connector 949. A second product term line 991 is connected to a second input terminal of programmable signal connector 949. An asynchronous preset line connects the asynchronous preset output terminal of programmable signal connector 949 to asynchronous preset terminal AP of programmable logic element 946. An asynchronous reset line connects the asynchronous reset output terminal of programmable signal connector 949 to asynchronous reset terminal AR of programmable logic element 946.

The coupling of product terms 990, 991 to asynchronous preset terminal AP and asynchronous reset terminal AR by programmable signal connector 949 is determined by architectural cell 939. Table 2 illustrates one embodiment of the configuration of programmable signal connector 949 for specific states of cell 939.

TABLE 2

Architectural Cell Configuration for
Programmable Signal Connector in the Logic Macrocell

| Cell 939 | Programmable Signal Connector Configuration |
|---|---|
| 0 | OR gate 931 connected to asynchronous preset line; and Product term 991 connected to asynchronous reset line; |
| 1 | Product term 991 connected to asynchronous preset line; and Or gate 931 connected to asynchronous reset line. |

All logic macrocells BC0 to BC15 (FIG. 2) in programmable logic block 201-A share product terms 990, 991, in this embodiment. However, architectural cell 939 permits each logic macrocell 945A to swap the function of product terms 990, 991. Thus, within a programmable logic block, each logic macrocell 945A can be configured by a particular control product term selected from product terms 990, 991 as required by a user. This flexibility permits the user to configure sixteen logic macrocells BC0 to BC15 in many different ways to utilize the asynchronous preset and reset capability of the logic macrocell.

Architectural cells 947 and 948 are used to configure programmable logic element 946 so that the signal on output terminal Q of programmable logic element 946 is one of: (i) a D-type flip-flop output signal; (ii) a T-type flip-flop output signal; (iii) a latch output signal; and (iv) a combinatorial output signal. Table 3 illustrates one embodiment of the programming of architectural cells 947 and 948 and the corresponding function of programmable logic element 946. In Table 3, a zero corresponds to a logic zero and is equivalent to a programmed state and a one corresponds to a logic one and is equivalent to an unprogrammed or erased state. Of course, as is known to those skilled in the art, alternative definitions of the programmed and unprogrammed states may be used with the principles of this invention to define alternative embodiments of the family of high performance, high density, programmable logic structures of this invention.

TABLE 3

Architecture Cells Configuration for Particular Output Macrocell Function

| Cell 947 | Cell 948 | Output Selection |
|---|---|---|
| 0 | 0 | D-Type flip-flop |
| 0 | 1 | T-Type flip-flop |
| 1 | 0 | Transparent Latch |
| 1 | 1 | Combinatorial |

In the preceding and following discussion, for ease of expression, only programmable architectural cells are described. The cells in these applications may be fuses, EPROM cells, EEPROM cells, RAM cells, or CMOS antifuse technology in accordance with the invention. The architectural cells are a means for providing either an input select signal or an output select signal to a programmable component so that the component passes a desired signal therethrough or alternatively functions as a specific component in a group of components such as that described above for programmable logic element 946.

In this embodiment, when programmable logic element 946 is configured as a latch, the latch has an input terminal D/T/L/C, an output terminal Q, a latch enable terminal CLK/LE, an asynchronous preset terminal AP and an asynchronous reset terminal AR. The latch is a transparent latch. When the signal on latch enable terminal CLK/LE is high, the latch is in the transparent mode, and the signal on output terminal Q responds to the signal on input terminal D/T/L/C. When the signal on the latch enable CLK/LE terminal is low, the output signal is latched to retain the data set up on the input terminal. The signals on preset terminal AP and reset terminal AR dominate when either signal is active in conjunction with a low signal on latch enable terminal CLK/LE. The other modes of operation associated with other combinations of signals on latch enable CLK/LE, preset AP, and reset AR terminals are defined as "other states" or "illegal states."

TABLE 4

| Mode # | Latch Enable (LE) | Asyn RESET (AR) | Asyn PRESET (AP) | Latch Mode |
|---|---|---|---|---|
| | | Allowed States | | |
| 1 | 1 | 0 | 0 | Transparent Mode |
| 2 | 0 | 0 | 0 | Latched Mode or Storage Mode |
| 3 | 0 | 0 | 1 | SET mode, Q = H |
| 4 | 0 | 1 | 0 | RESET mode, Q = L |
| | | Other States | | |
| 5 | 0 | 1 | 1 | RESET Dominates |
| 6 | 1 | 0 | 1 | SET Dominates, Q = H |
| 7 | 1 | 1 | 0 | Latch output follows Data Input |
| 8 | 1 | 1 | 1 | Latch output follows Data Input |

The particular bit sequences in Table 4 are illustrative only of one embodiment of this invention and are not intended to limit the invention to the particular embodiment disclosed. In view of this disclosure, those skilled in the art will be able to configure the programmable features of this invention using a variety of different values for the programming bits.

An output terminal of a programmable four-to-one multiplexer 943A with two architectural cells 941, 942 is connected to the clock/latch enable terminal CLK/LE of programmable logic element 946. In one embodiment, the PLD of this invention includes four dedicated input pins that may be used either as pins for dedicated input signals, pins for clock/latch enable signals, or pins for input signals and clock/latch enable signals. The signals from these four dedicated input pins CK0/LE0/I0, CK1/LE1/I1, CK2/LE2/I2, CK3/LE3/I3 are input signals to programmable four-to-one multiplexer 943A.

Each logic macrocell 945A is clocked/latched on an individual macrocell basis by the signal from programmable four-to-one multiplexer 943A. This individual clocking/latch enabling allows the user to implement flexible and multiple state machines in a single PLD. Further, even if either of the global clock/latch enable input pins is used as a clock/latch enable signal source, the pin is still available as an input pin to the switch matrix.

The signal passed through programmable four-to-one multiplexer 943A to programmable logic element 946 is determined by architectural cells 941, 942. Table 5 illustrates one embodiment of the programming of architectural cells 941 and 942 and the corresponding input signal passed through programmable four-to-one multiplexer 943A to terminal CLK/LE of programmable logic element 946. In Table 5 and in each of the tables below, a zero corresponds to a logic zero and is equivalent to a programmed state and a one corresponds to a logic one and is equivalent to an unprogrammed or erased state. Of course, as is known to those skilled in the art, alternative definitions of the programmed and unprogrammed states may be used with the principles of this invention to define alternative embodiments of the family of high performance, high density, programmable logic structures of this invention.

TABLE 5

Architectural Cell Configuration for Selection of Signal
Applied to Output Macrocell Terminal CLK/LE

| Cell 941 | Cell 942 | Clock/LE Selection |
|---|---|---|
| 0 | 0 | Global Clock 0/LE 0/Input 0 |
| 0 | 1 | Global Clock 1/LE 1/Input 1 |
| 1 | 0 | Global Clock 2/LE 2/Input 2 |
| 1 | 1 | Global Clock 3/LE 3/Input 3 |

The large number of registers available in logic macrocells BC0 to BC15 in each programmable logic block 201-A (FIG. 2) of this invention with four clock sources for each register allows system designers to implement flexible and multiple state machines in a single PLD.

Thus, a logic macrocell 945A, according to this invention, may be configured so that the output signals are either registered, latched, or combinatorial with an active high or an active low polarity. When the logic macrocell is used as a register, the logic macrocell can be further configured as a D-type or T-type flip-flop. Programmable polarity along with the built-in T-type flip-flop capability minimizes the number of product terms required for implementing some logic functions.

Each logic macrocell 945A provides an output signal on line "An" to output switch matrix bank 240-A and also sends the output signal to input switch matrix bank 220-A. The feedback signal is provided for either a registered, a latched or a combinatorial signal and is always available regardless of the configuration of output switch matrix bank 240-A, described more completely below. Since the feedback signal may be either registered, latched, or combinatorial, the feedback signal allows for buried sequential or combinatorial functions.

In yet another embodiment (not shown), programmable logic element 946 is replaced with a programmable logic element which functions as one of a T-type flip-flop, a D-type flip-flop, a J-K flip-flop, an SR flip-flop, a transparent latch, and a combinatorial signal path. Since in this embodiment the programmable logic element functions in one of six modes, three architectural cells are required for the programmable logic element. Also, an additional input line or lines may be required to support the function of the J-K flip-flop or the SR flip-flop. In this embodiment, the product term controlled by programmable connection 937 can be used for the J-K flip-flop or the SR flip-flop emulation.

Second Embodiment of Logic Macrocells

Figure 9B:
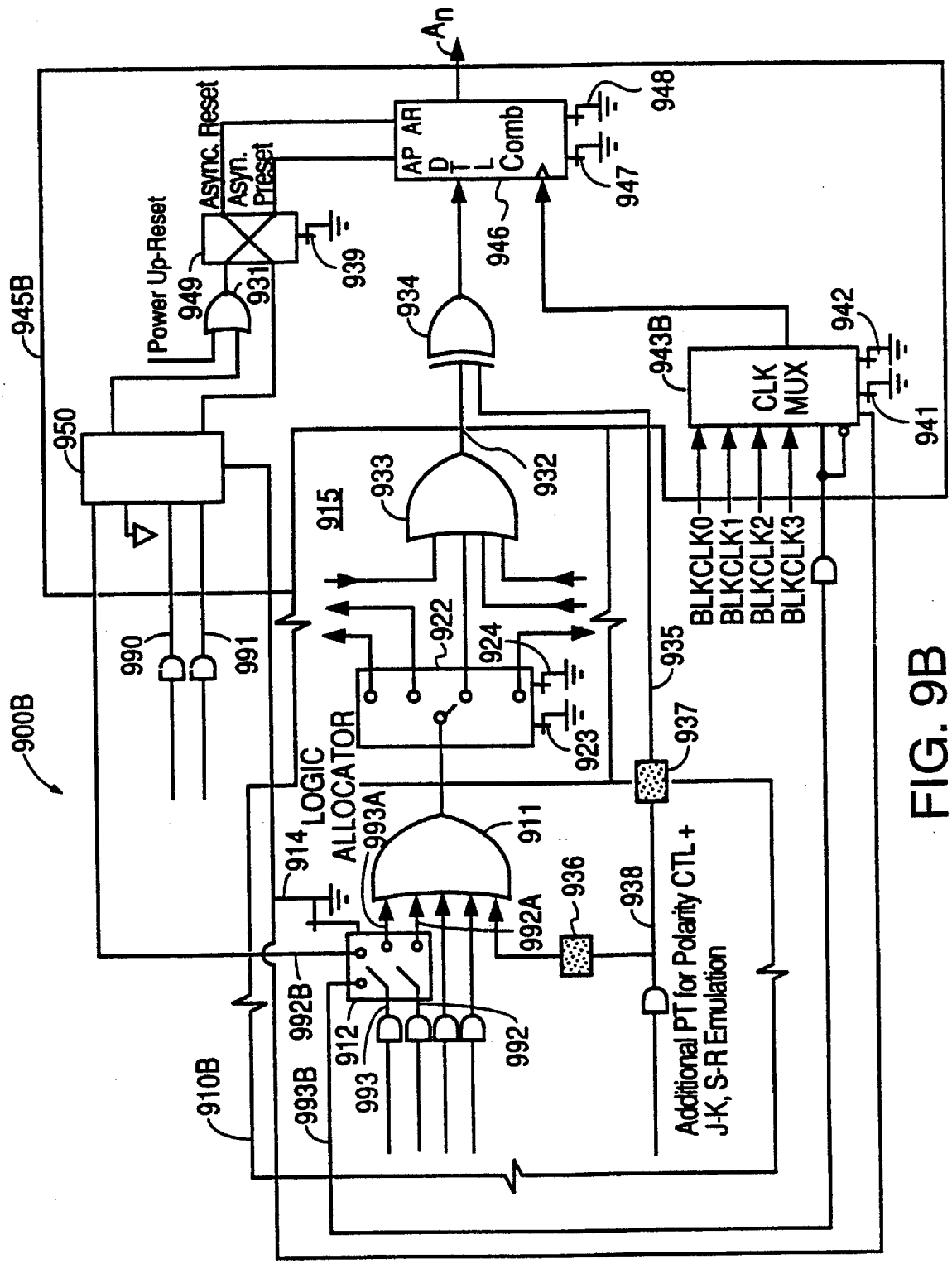
FIG. 9B is a detailed block diagram of another embodiment of the programmable logic block cell of this invention.

In this embodiment, each programmable logic block has eighty logic product terms that are grouped in sixteen clusters of five product terms. In each five product term cluster, three product terms 938, 992, 993 (FIG. 9B) are programmably available to the cluster and the other two product terms are fixed to the cluster. FIG. 9B is a conceptual schematic diagram of a programmable logic block cell 900B that is used to construct the programmable logic block in this embodiment. Each cell 900B includes one of the sixteen product term clusters 910B in the programmable logic array, a router element 915 in the logic allocator, and a logic macrocell 945B. Logic macrocell 945B has programmable registered, combinatorial or latched capability. If logic macrocell 945B is programmably configured as a register, a macrocell storage element is configured as one of an edge triggered D-type flip-flop, and a T-type flip-flop. Each logic macrocell 945B has individually programmable output signal polarity. Logic macrocell output signal "An" is always available to input switch matrix bank 220-A and to output switch matrix 240-A.

As illustrated in the embodiment in FIG. 9B, product term 938 drives a programmable connection 936 and programmable polarity control element 937. Programmable connection 936 programmably connects and disconnects product term 938 to OR gate 911. An architectural cell is used to configure programmable connection 936. Programmable connection 912 programmably connects and disconnects (i) a first product term 993 to clock multiplexer 943B in logic macrocell 945B and to OR gate 911, and (ii) a second product term 992 to an input terminal of programmable asynchronous signal source selector 950 in logic macrocell 945B and to OR gate 911. Architectural cell 914 configures programmable connection 912 and provides an architecture control signal to clock multiplexer 943B and to programmable asynchronous signal source selector 950.

Thus, as described above, the cluster of product terms driving OR gate 911 includes two fixed product terms and three product terms 938, 992, 993 that are programmably available to the cluster.

Programmable connection 912 along with programmable asynchronous signal source selector 950 and clock multiplexer 943B, which are described more completely below, represent a significant advance in high density synchronous/asynchronous PLDs. With cell 900B of this invention, a single PLD is made, and the user programmably configures each cluster of product terms and consequently each logic macrocell in each programmable block in the PLD for either asynchronous or synchronous operations by configuring programmable connection 912 for the particular cluster. Thus, a single PLD supports synchronous and asynchronous operations without diminishing the number of registers available to the user. Further, since only programmable connections are required to steer the product terms no appreciable complexity in terms of user understanding is introduced by supporting both synchronous and asynchronous operations in a single PLD.

In this embodiment, a single programmable architecture cell 914 is used to configure both asynchronous product terms 992, 993 in the product term cluster for asynchronous functions. However, in another embodiment, a second architecture cell is used so that asynchronous product terms 992, 993 are individually steerable. The major advantage of using individual architecture cells to steer individual product terms is that potential waste of product terms is minimized.

Programmable polarity control element 937 in this embodiment is identical to programmable polarity control element 937 in cell 900A described above, and that description is incorporated herein by reference. Again, the signal on line 935 drives a first input terminal of XOR gate 934. Output line 932 from OR gate 933 in logic allocator 915 is connected to a second input terminal of XOR gate 934. XOR gate 934 is a polarity control means. The operation of XOR gate 934 is identical to that described above for cell 900A and that description is incorporated herein by reference.

The output signal of XOR gate 934 drives input terminal D/T/L/C of programmable logic element 946. Output terminal Q of programmable logic element 946 drives line "An" to both input switch matrix bank 220-A and output switch matrix bank 240-A. The structure and operation of programmable logic element 946 itself in this embodiment is identical to the structure and operation of the programmable logic element in cell 900A and that description is incorporated herein by reference.

However, in this embodiment, the connections to asynchronous reset terminal AR and asynchronous preset terminal AP of programmable logic element 946 permit a control product term for each programmable logic element in the programmable logic block (PLB). Specifically, one of the steerable product terms from product term cluster 910B, e.g., product term 992, is programmably connected and disconnected to a first input terminal of programmable asynchronous signal source selector 950 by programmable connection 912. A second input terminal of programmable asynchronous signal source selector 950 is grounded while a third input terminal is connected to product term 990 and a fourth input terminal is connected to product term 991.

An input select signal to programmable asynchronous signal source selector 950 programmably connects and disconnect (i) the first and second input terminals of programmable asynchronous signal source selector 950 to first and second output terminals, respectively, and (ii) the third and fourth input terminals of programmable asynchronous signal source selector 950 to first and second output terminals, respectively. In this embodiment, the state of the input select signal for programmable asynchronous signal source selector 950 is determined by architectural cell 914. When architectural cell 914 is configured to steer product term 992 to programmable asynchronous signal source selector 950, programmable asynchronous signal source selector 950 passes product term 992 therethrough to the first output terminal and the second output terminal is grounded. Conversely, when architectural cell 914 steers product terms 992, 993 to OR gate 911, programmable asynchronous signal source selector 950 passes product term 990 therethrough to the first output terminal and product term 991 therethrough to the second output terminal.

The first output terminal of programmable asynchronous signal source selector 950 is connected to a first input terminal of OR gate 931. A second input terminal of OR gate 931 is driven by a power-up reset signal. The output signal of OR gate 931 is connected to a first input terminal of programmable signal connector 949. The second output terminal of programmable asynchronous source selector 950 is connected to a second input terminal of programmable signal connector 949. An asynchronous preset line connects the asynchronous preset output terminal of programmable signal connector 949 to asynchronous preset terminal AP of programmable logic element 946. An asynchronous reset line connects the asynchronous reset output terminal of programmable signal connector 949 to asynchronous reset terminal AR of programmable logic element 946.

Thus, in this embodiment, the asynchronous operation of programmable logic element 946 is controlled by programmable asynchronous signal source selector 950 and programmable signal connector 949. When architectural cell 914 is configured to steer the product term to programmable asynchronous signal source selector 950, in this embodiment, programmable asynchronous signal source selector 950 is configured to pass the product term therethrough to an output terminal, as described above. In this embodiment, only a single product term 992 is available to programmable signal connector 949. Thus, architectural cell 939 effectively can apply a signal to either asynchronous preset terminal AP or synchronous reset AR of programmable logic element 946. Table 6 illustrates one embodiment of the configuration for architectural cell 939 and the resulting connections. This configuration of architectural cell 939 is only illustrative of the principles of this invention and is not intended to limit the invention to the particular configuration given in Table 6.

TABLE 6

Architectural Cell Configuration for
Programmable Signal Connector 949 in Logic Macrocell 945B
with Architectural Cell 914 Steers A Product Term To
Programmable Asynchronous Signal Source Selector 950

| Cell 939 | Programmable Signal Connector Configuration |
|---|---|
| 0 | OR gate 931 connected to asynchronous preset line; and asynchronous reset line grounded; |
| 1 | Asynchronous preset line is grounded; and OR gate 939 connected to asynchronous reset line. |

Thus, in this embodiment, architecture cell 939 is configured for each logic macrocell to provide the logic macrocell with either an individual asynchronous preset capability or an individual asynchronous reset capability.

Figure 9D:
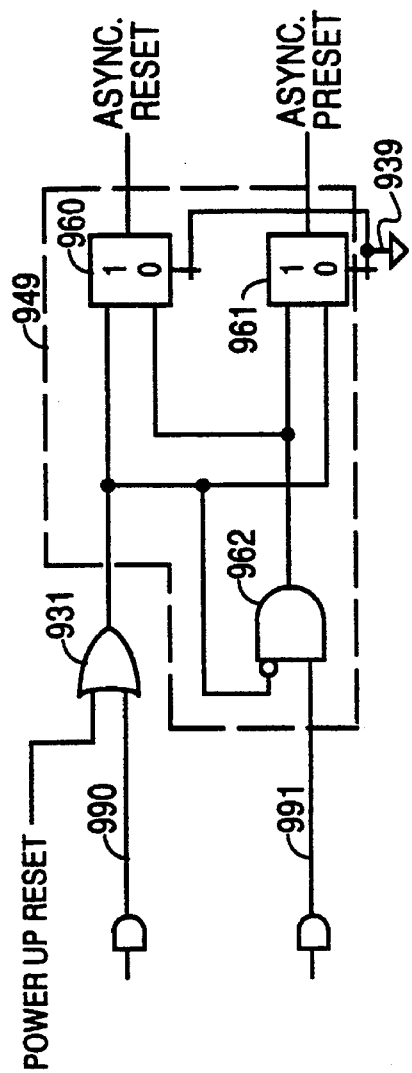
FIGS. 9C and 9D are detailed diagrams of the programmable signal connector of this invention with two different input signal configurations.
Figure 9C:
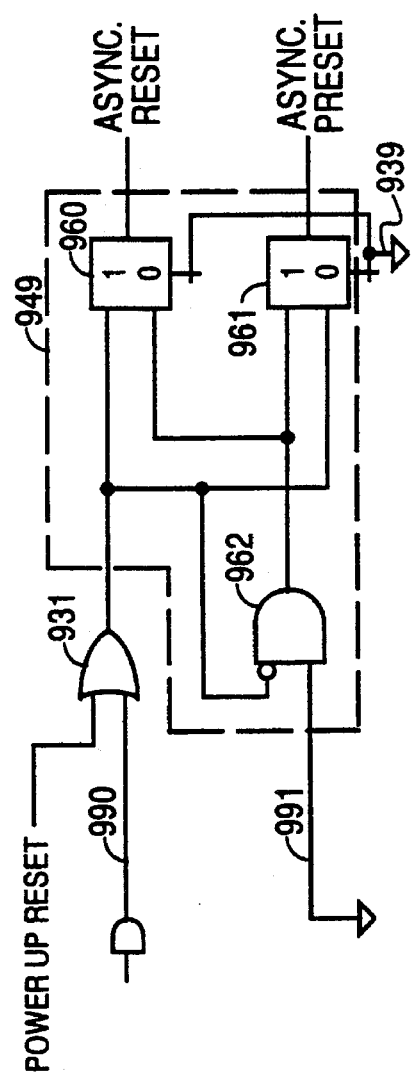

FIG. 9C is a more detailed schematic diagram of one embodiment of programmable signal connector 949 with product term 992 from the product term cluster and the ground connected to the two input terminals, respectively. Programmable signal connector 949 includes an AND gate 962 with an inverter on one of its input terminals and two two-to-one programmable multiplexers 960, 961.

When architectural cell 914 is configured to steer product terms 992, 993 to OR gate 911, in this embodiment, programmable asynchronous signal source selector 950 is configured to pass product terms 990, 991 therethrough to the output terminals, as described above. Thus, in this configuration, architectural cell 939 configures programmable signal connector 949 so that it functions in the same manner as in the first embodiment of programmable logic block cell 900A described above, because product term 991 drives one terminal of OR gate 931 which in turn drives the first input terminal of programmable signal connector 949 and product term 991 drives the second input terminal of programmable signal connector 949. Therefore, the function and operation of programmable signal connector 949 described above for programmable logic block cell 900A is incorporated herein by reference.

FIG. 9D is a more detailed schematic diagram of one embodiment of programmable signal connector 949 with product terms 990, 991 connected to the two input terminals. As described above, programmable signal connector 949 includes two two-to-one programmable multiplexers 960, 961 and an AND gate 962 with an inverter on one of its input terminals.

In this embodiment, as noted above, exclusive OR gate 934 (FIG. 9B) and programmable logic element 946 are identical to those described above for cell 900A and that description is incorporated herein by reference. However, clock multiplexer 943B, in this embodiment, is somewhat different from clock multiplexer 943A. An output terminal of a programmable six-to-one multiplexer 943B with two architectural cells 941, 942 and an architectural configuration signal from architectural cell 914 is connected to the clock/latch enable terminal CLK/LE of programmable logic element 946.

Clock multiplexer 943B receives four input signals BLK-CLK0 to BLKCLK3 that are derived from signals from dedicated input pins, as described more completely below. The fifth and sixth input signals are provided by product term 993 steered from the product term cluster by architectural cell 914. Product term 993 is applied to the fifth input terminal and the complement of product term 993 is applied to the sixth input terminal.

The signal passed through six-to-one programmable multiplexer 943B is determined by the configuration of architectural cells 941 and 942 and the input select signal from architectural cell 914. Of course, in another embodiment, the input select signal from architectural cell 914 could be replaced by a third discrete architectural cell for multiplexer 943B.

Table 7A gives a first configuration for architectural cells 941 and 942 and the input select signal for multiplexer 943B in the synchronous mode, i.e., the input select signal is a logic one. Table 7B gives a second configuration for architectural cells 941 and 942 and the input select signal for multiplexer 943B in the asynchronous mode, i.e., the input select signal is a logic zero. The architectural cell values and the input select signal values in Tables 7A and 7B are illustrative only, and are not intended to limit the invention to the particular values shown.

TABLE 7A

| Input Select Signal | Cell 941 | Cell 942 | Signal Supplied Terminal CLK/LE of Logic Element 946 |
|---|---|---|---|
| X | 0 | 0 | BLKCLK0 |
| X | 0 | 1 | BLKCLK1 |
| 1 | 1 | 0 | BLKCLK2 |
| 1 | 1 | 1 | BLKCLK3 |

TABLE 7B

| Input Select Signal | Cell 941 | Cell 942 | Signal Supplied Terminal CLK/LE of Logic Element 946 |
|---|---|---|---|
| X | 0 | 0 | BLKCLK0 |
| X | 0 | 1 | BLKCLK1 |
| 0 | 1 | 0 | Product Term 993 |
| 0 | 1 | 1 | Complement of Product Term 993 |

In Tables 7A and 7B, a zero corresponds to a logical zero and is equivalent to a programmed state and a one corresponds to a logical one and is equivalent to an unprogrammed or erased state. An "X" is a don't care condition.

In one embodiment, the PLD of this invention includes four dedicated input pins that may be used either as pins for dedicated input signals, pins for clock/latch enable signals, or pins for input signals and clock/latch enable signals. The signals from these four dedicated input pins CK0/LE0/I0, CK1/LE1/I1, CK2/LE2/I2, CK3/LE3/I3 are input signals BLKCLK0 to BLKCLK3, respectively to programmable six-to-one multiplexer 943B, in one embodiment.

Figure 10A:
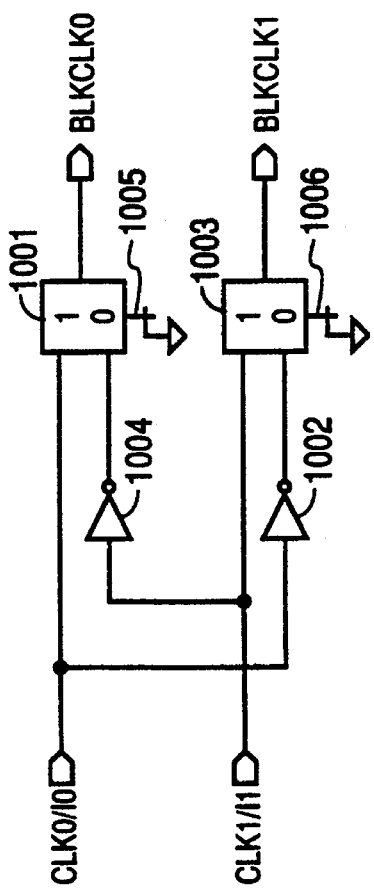
FIGS. 10A and 10B are a schematic diagram of generation circuitry for the multiple clock signal configurations of this invention.

In another embodiment, the signal from input pin CK0/LE0/I0 drives a first input terminal of a first two-to-one programmable multiplexer 1001 (FIG. 10A) and a first inverter 1002. The signal from input pin CK1/LE1/I1 drives a first input terminal of a second two-to-one programmable multiplexer 1003 and a second inverter 1004. The output signal from inverter 1002 drives a second input terminal of two-to-one programmable multiplexer 1003 while the output signal from inverter 1004 drives a second input terminal of two-to-one programmable multiplexer 1001.

Architectural cell 1005 provides an input select signal to two-to-one programmable multiplexer 1001 and in response thereto, two-to-one programmable multiplexer 1001 passes one of the two input signals to line BKLCLK0. Similarly, architectural cell 1006 provides an input select signal to two-to-one programmable multiplexer 1006 and in response thereto, two-to-one programmable multiplexer 1003 passes one of the two input signals to line BKLCLK1. The numbers within multiplexers 1001 and 1003 represent one embodiment of the state of the architectural cell when the signal on the input terminal next to the number is passed through the multiplexer.

Figure 10B:
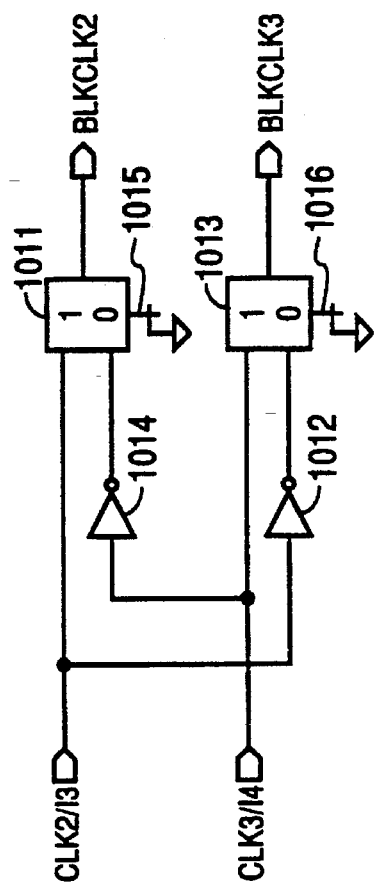

In this embodiment, the signal from input pin CK2/LE2/I2 drives a first input terminal of a first two-to-one programmable multiplexer 1011 (FIG. 10B) and a first inverter 1012. The signal from input pin CK3/LE3/I3 drives a first input terminal of a second two-to-one programmable multiplexer 1013 and a second inverter 1014. The output signal from inverter 1012 drives a second input terminal of two-to-one programmable multiplexer 1013 while the output signal from inverter 1014 drives a second input terminal of two-to-one programmable multiplexer 1011.

Architectural cell 1015 provides an input select signal to two-to-one programmable multiplexer 1011 and in response thereto, two-to-one programmable multiplexer 1011 passes one of the two input signals to line BKLCLK2. Similarly, architectural cell 1016 provides an input select signal to two-to-one programmable multiplexer 1016 and in response thereto, two-to-one programmable multiplexer 1013 passes one of the two input signals to line BKLCLK3. The numbers within multiplexers 1011 and 1013 represent one embodiment of the state of the architectural cell when the signal on the input terminal next to the number is passed through the multiplexer. Table 8 is one embodiment of the signals on lines BKLCLK0 to BKLCLK3 for the possible configurations of architectural cells 1005, 1006, 1015, 1016.

TABLE 8

| STATE OF ARCHITECTURAL CELL | | | | INPUT SIGNALS TO CLOCK MULTIPLEXER 943B | | | |
|---|---|---|---|---|---|---|---|
| Cell 1005 | Cell 1006 | Cell 1015 | Cell 1016 | BLK-CLK0 | BLK-CLK1 | BLK-CLK2 | BLK-CLK3 |
| 0 | 0 | 0 | 0 | $\overline{\text{CLK1}}$ | $\overline{\text{CLK0}}$ | CLK3 | CLK2 |
| 1 | 0 | 0 | 0 | CLK0 | $\overline{\text{CLK0}}$ | CLK3 | CLK2 |
| 0 | 1 | 0 | 0 | $\overline{\text{CLK1}}$ | CLK1 | CLK3 | CLK2 |
| 0 | 0 | 1 | 0 | $\overline{\text{CLK1}}$ | $\overline{\text{CLK0}}$ | CLK2 | CLK2 |
| 0 | 0 | 0 | 1 | $\overline{\text{CLK1}}$ | $\overline{\text{CLK0}}$ | CLK3 | CLK3 |
| 1 | 1 | 0 | 0 | CLK0 | CLK1 | CLK3 | CLK2 |
| 1 | 0 | 1 | 0 | CLK0 | $\overline{\text{CLK0}}$ | CLK2 | CLK2 |
| 1 | 0 | 0 | 1 | CLK0 | $\overline{\text{CLK0}}$ | CLK3 | CLK3 |
| 0 | 1 | 1 | 0 | $\overline{\text{CLK1}}$ | CLK1 | CLK2 | CLK2 |
| 0 | 1 | 0 | 1 | $\overline{\text{CLK1}}$ | CLK1 | CLK3 | CLK3 |
| 0 | 0 | 1 | 1 | $\overline{\text{CLK1}}$ | $\overline{\text{CLK0}}$ | CLK2 | CLK3 |
| 1 | 1 | 1 | 0 | CLK0 | CLK1 | CLK2 | CLK2 |
| 1 | 1 | 0 | 1 | CLK0 | CLK1 | CLK3 | CLK3 |
| 1 | 0 | 1 | 1 | CLK0 | $\overline{\text{CLK0}}$ | CLK2 | CLK3 |
| 0 | 1 | 1 | 1 | $\overline{\text{CLK1}}$ | CLK1 | CLK2 | CLK3 |
| 1 | 1 | 1 | 1 | CLK0 | CLK1 | CLK2 | CLK3 |

In Table 8, "CLK0" is the signal from dedicated input pin CK0/LE0/I0, "CLK1" is the signal from dedicated input pin CK1/LE1/I1, "CLK2" is the signal from dedicated input pin CK2/LE2/I2, and "CLK3" is the signal from dedicated input pin CK3/LE3/I3. "$\overline{\text{CLK0}}$" is the complement of signal "CLK0" and so on.

Thus, in this embodiment, the user can select from sixteen different combinations of clock signals derived from signals on the four input pins. As will be appreciated by those skilled in the art, the clock signal sources derived from the four dedicated input pins, as represented in Table 8, can also be used to drive clock multiplexer 943A in cell 900A, described above.

In addition, the large number of registers available in logic macrocells BC0 to BC15 in each programmable logic block 201-A (FIG. 2) of this invention with four clock sources for each register allows system designers to implement flexible and multiple state machines in a single PLD.

Thus, with cell 900B of this invention, the resulting programmable logic block retains the full synchronous capability of the programmable logic block constructed using cell 900A and in addition, each programmable logic macrocell in a programmable logic block formed with cell 900B can be configured to support asynchronous applications simply by configuring a single architectural cell. This ability to support both synchronous and asynchronous applications with no loss of register capability with a single PLD and with fixed, predictable, and deterministic pin-to-pin signal propagation delays for both synchronous and asynchronous applications is a significant advancement over the prior art PLDs described above.

Table 9 is a summary of the capability of a programmable logic block formed with cell 900B of this invention. As explained above, the synchronous mode column of the table applies to programmable logic block formed with either cell 900A or cell 900B of this invention.

TABLE 9

|  | Synchronous Mode | Asynchronous Mode |
|---|---|---|
| Logic Product Term Cluster Size | 4 or 5 | 2 or 3 |
| Maximum Number of Product Terms per Logic Macrocell | 16 to 20 | 14 to 18 |
| Control Product Terms | -2 Common to all Logic Macrocells For Common Set/Reset -Individual Swap | -1 for each Logic Macrocell For Individual Set/Reset -Individual Swap |
| Clocking | Dedicated Input Pins Only | Dedicated Input Pins plus Individual Product Term |

Input Macrocells

Input macrocells 206-A (FIG. 2) provide registered, or latched, and dedicated input signal capability from an I/O pin to centralized switch matrix 130. Input macrocells 206-A provide both registered and non-registered data signals simultaneously to centralized switch matrix 130. The simultaneous availability of both registered and non-registered data signals simultaneously to centralized switch matrix 130 makes the PLD of this invention much more useful for interfaces to microprocessors for multiplexed and non-multiplexed applications than prior art PLDs.

If the I/O pin is not utilized as an input pin, input macrocells 206-A provide additional registered or latched feedback signal capability to input switch matrix bank 220-A for the output signals from I/O macrocells 203-A. The feedback signals from input macrocells 206-A to input switch matrix bank 220-A are always available irrespective of the configuration of I/O macrocells 203-A.

Figure 11:
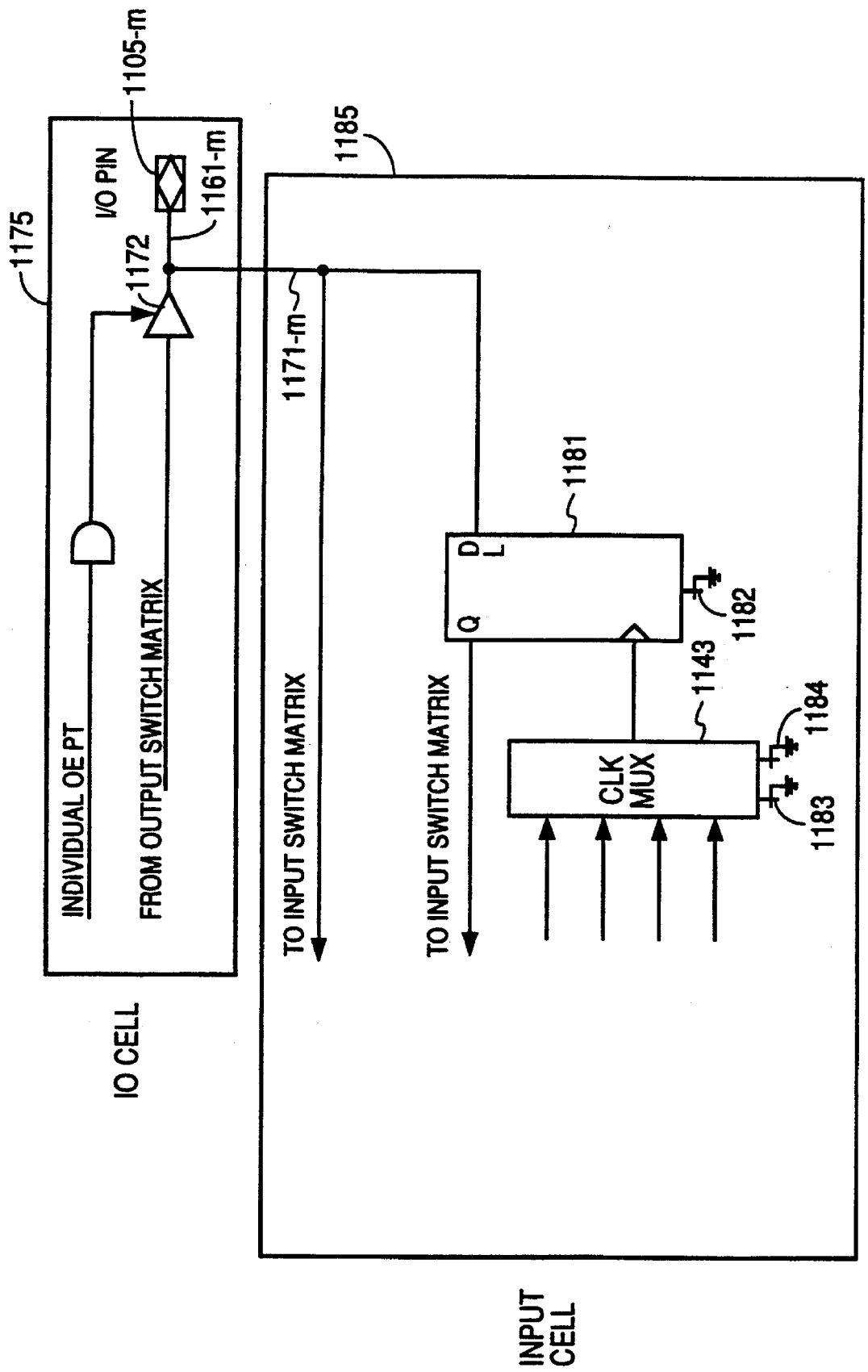
FIG. 11 is a more detailed block diagram of the input logic macrocell and input/output cell of this invention.

FIG. 11 is a more detailed diagram of one input macrocell 1185 in input macrocells 206-A. In this embodiment, all input macrocells in the PLD are identical. I/O pin 1105-m is connected to I/O macrocell 1175 by line 1171-m. In I/O macrocell 1175, line 1171-m is connected to line 1161-m. Line 1171-m is also connected to input terminal D/L of programmable storage element 1181 and to input switch matrix bank 220-A. Consequently, any signal on pin 1105-m is also applied to input terminal D/L and to input switch matrix bank 220-A.

Output terminal Q of programmable storage element 1181 is connected to input switch matrix bank 220-A. In this embodiment, programmable storage element 1181 is programmable as one of a D-type flip-flop and a transparent latch. The configuration of programmable storage element 1181 is determined by architectural cell 1182. The configuration for the two values of architectural cell 1182 are given in Table 10.

TABLE 10

Architectural Cell Configuration for
Programmable Storage Element in the Input Macrocell

| Cell 1182 | Programmable Storage Element Configuration |
|---|---|
| 0 | D-Type flip-flop |
| 1 | Transparent Latch |

Input macrocell 1185 also includes a programmable four-to-one multiplexer 1143 which has an output line connected to terminal CLK/LE of programmable storage element 1181. The configuration and operation of programmable four-to-one multiplexer 1143 is identical to that described above for logic macrocells 945A and that description is incorporated herein by reference.

The logic capability of input macrocell 1185 is in addition to the logic capability of the logic macrocells, described above. Since separate registered/latched input signals are available to input switch matrix bank 220-A, the PLDs of this invention allow simultaneous usage of the logic macrocell feedback signal and the registered/latched input signal.

The I/O Cell

I/O cell 1175 of this invention is illustrated in FIG. 11 also. I/O macrocell 1175 has a single three-state buffer 1172 coupled to I/O pin 1105-m. The input terminal of three-state buffer 1172 is connected to an output line of output switch matrix bank 240-A. The output terminal of three-state buffer 1172 is connected to I/O pin 1105-m by line 1161-m. The output enable terminal of three-state buffer 1172 is connected to a product control term in the plurality of output enable product control terms described above.

When the output enable product term has a first logic level, the signal on the input terminal of buffer 1172 is passed therethrough to the output terminal. Thus, I/O pin 1105-m is configured as an output pin. When the output enable product term has a second logic level, buffer 1172 has a high impedance state. Thus, I/O pin 1105-m is configured as an input pin. Consequently, I/O pin 1105-m functions as a bidirectional I/O pin which is controlled by the product term.

As previously explained, each I/O cell 1175 has its own output enable product term. The use of individual product terms for each I/O cell 1175 significantly enhances the capability of the PLDs of this invention over prior art PLDs that only have banked output enable capability.

Output Switch Matrix

Figure 12:
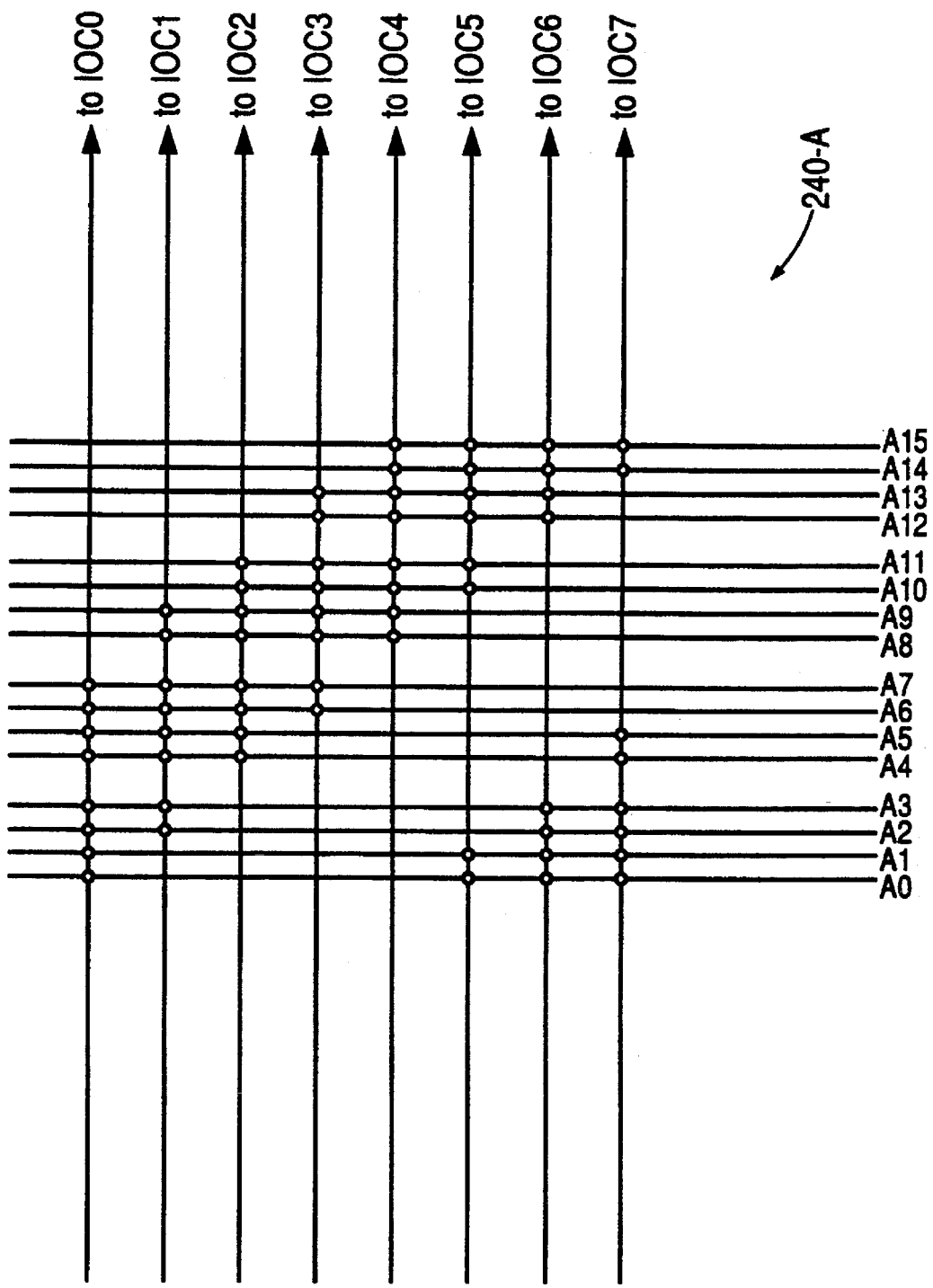
FIG. 12 is a schematic diagram of one embodiment of the programmable output switch matrix bank of this invention.

Output switch matrix bank 240-A this invention is illustrated in more detail in FIG. 12. As explained above, in this embodiment, output switch matrix bank 240-A includes a multiplicity of eight-to-one programmable multiplexers. In FIG. 12, the vertical lines represent signal input lines to output switch matrix bank 240-A. Specifically, the sixteen vertical lines A0 to A15 provide output signals from logic macrocells BC0 to BC15, respectively. The eight horizontal lines are each an input line to one I/O cell in I/O cells 203-A. The circles at the intersections of the horizontal and vertical lines represent programmable connections. Hence, the circles on a particular horizontal line represent the eight programmable connections between eight input lines and the output line of the particular multiplexer.

In this particular configuration, first I/O cell IOC0 can receive a signal from any one of programmable logic macrocells BC0 to BC7. Second I/O cell IOC1 can receive a signal from any one of programmable logic macrocells BC2 to BC9, and third I/O cell IOC2 from any one of programmable logic macrocells BC4 to BC11. Eighth I/O cell IOC7 can receive a signal from any one of programmable logic macrocells BC14 to BC5.

The particular configuration of output switch matrix bank 240-A illustrated in FIG. 12 is only illustrative of the principles of this invention and is not intended to limit the invention to the configuration illustrated. In view of this disclosure, one skilled in the art could use, for example, programmable 4:1 multiplexers, programmable 12:1 multiplexers, programmable 16:1 multiplexers, or even combinations of different size programmable multiplexers in output switch matrix bank 240-A. The important aspects are (i) that the programmable logic macrocells are programmably couplable and decouplable from the I/O cells so that the programmable logic macrocells may function as both buried logic macrocells and output logic macrocells and (ii) that the output signal of a programmable logic macrocell may be programmably steered to any one of a plurality of I/O pins.

Each eight-to-one programmable multiplexer in output switch matrix bank 240-A has three architectural cells which are used to configure the multiplexer so that only one of the input lines is connected to the output line. The architectural cells provide an input select signal to the multiplexer. Table 11 gives one embodiment of the programmable logic block for a particular configuration of the three architectural cells. Each column in Table 11 under an I/O pin reference numeral represents one 8:1 programmable multiplexer in output switch matrix bank 240-A.

IO6, and IO7. Specifically, $$\text{Routability factor} = \frac{\text{(Mux Size)(Number of Muxes)}}{\text{Number of Input Lines}}$$
$$= \frac{8 \times 8}{16}$$
$$= 4$$

Figure 13:
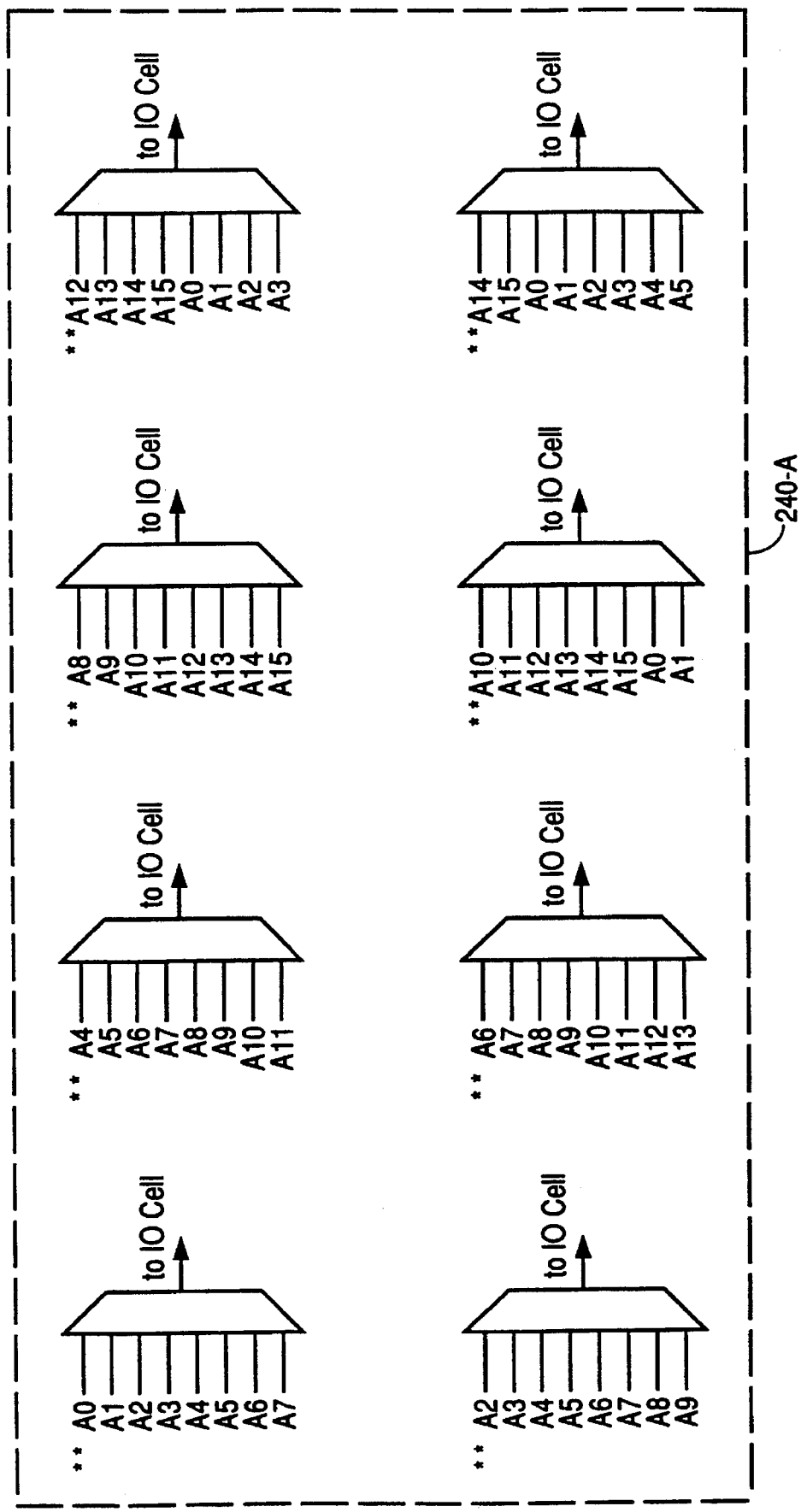
FIG. 13 is an alternative illustration of the programmable output switch matrix bank of FIG. 12.

FIG. 13 is an alternative illustration of the eight programmable multiplexers in output switch matrix bank 240-A. The input line with the "**" is the line connected to the output line in the default configuration of output switch matrix bank 240-A.

Input Switch Matrix

Input switch matrix bank 220-A receives thirty-two input signals. As described above, signals on lines A0 to A15 are from programmable logic macrocells BC0 to BC15. Signals on lines A0 to A15 are from input macrocells where signals A0, A2, ..., A14 are direct signals from the associated I/O pin and signals A1, A3, ..., A15 are either registered or latched signals.

Figure 14:
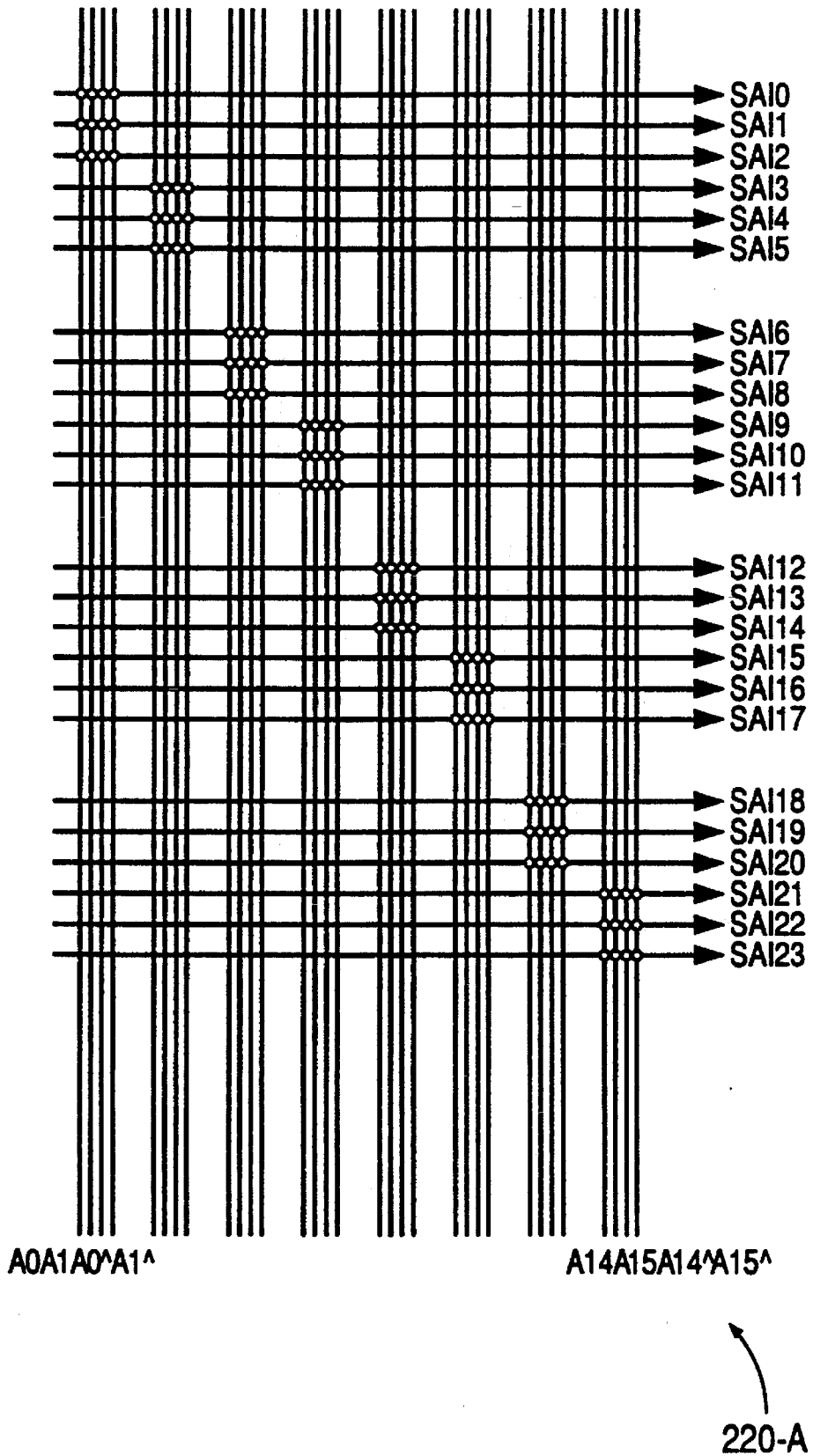
FIG. 14 is a schematic diagram of one embodiment of the programmable input switch matrix bank of this invention.

One embodiment of input switch matrix bank 220-A of this invention is illustrated in FIG. 14. As explained above, in this embodiment, input switch matrix bank 220-A includes a multiplicity of four-to-one programmable multiplexers. In FIG. 14, the vertical lines represent signal input lines to input switch matrix bank 220-A. Specifically, the thirty-two vertical lines are clustered in groups of four lines. The first cluster of four lines on the left hand side of FIG. 14 are connected to lines A0, A1, A0 and A1, respectively. The second cluster of four lines on the left hand side of FIG. 14 are connected to lines A2, A3, A2 and A3, respectively. This pattern of connection of the input lines is continued and the last cluster of four lines on the right hand side of FIG. 14 are connected to lines A14, A15, A14 and A15.

Twenty-four horizontal lines SAI0 to SAI23 are each an input line to centralized switch matrix 230. The circles at the intersections of the horizontal and vertical lines represent programmable connections. Hence, the circles on a particular horizontal line represent the four programmable connections between four input lines and the output line of the particular programmable multiplexer.

Figure 15:
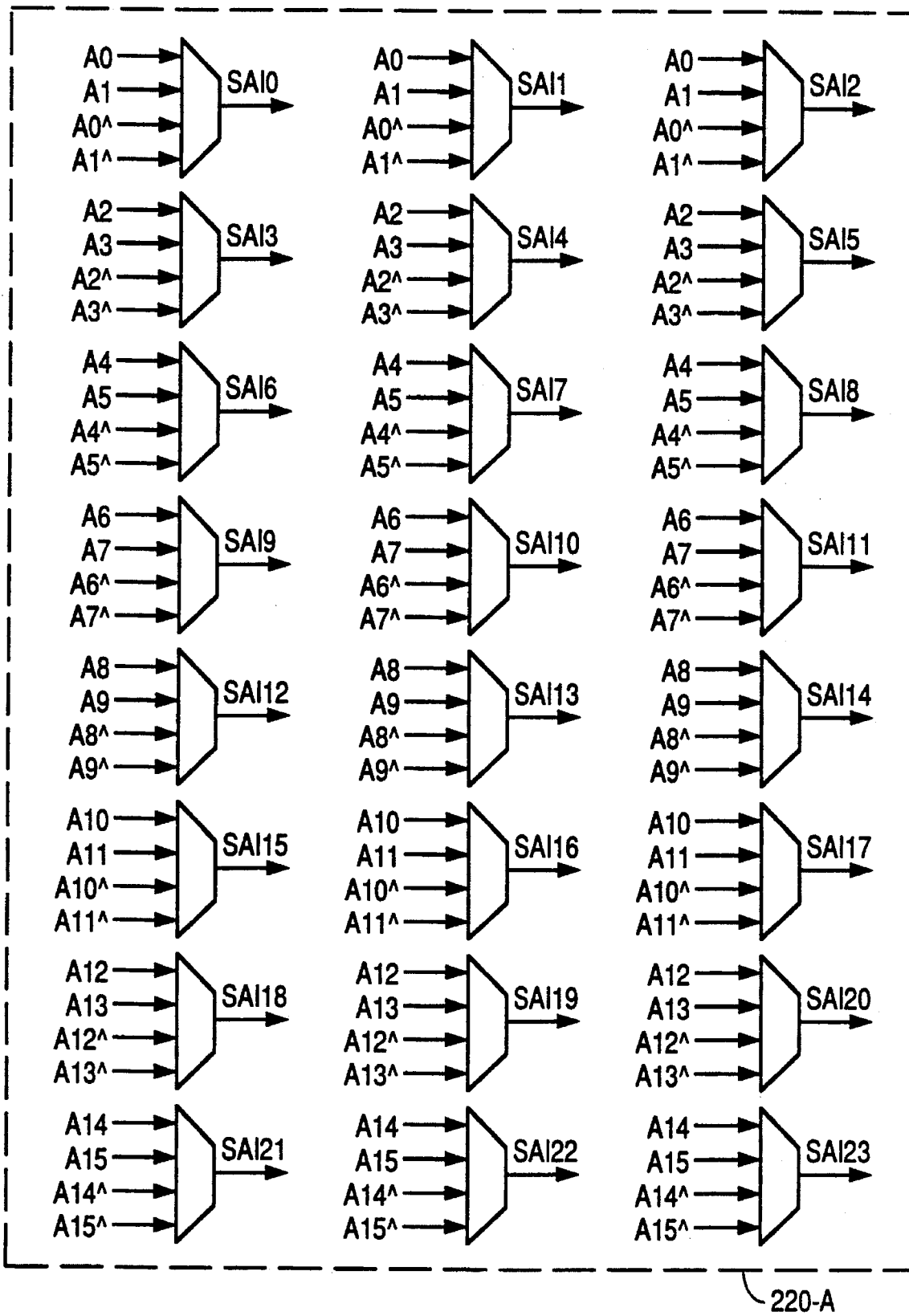
FIG. 15 is an alternative illustration of the programmable input switch matrix bank of FIG. 14.

The input lines to a particular multiplexer are shown in more detail in FIG. 15. In this embodiment, the cluster of four input lines are connected to three adjacent programmable multiplexers.

TABLE 11

PROGRAMMABLE LOGIC BLOCK OUTPUT LINE CONNECTED TO
I/O PIN BY OUTPUT SWITCH MATRIX FOR PARTICULAR
ARCHITECTURAL CELL CONFIGURATION

| Architectural Cell | | | I/O Pin | | | | | | | |
|---|---|---|---|---|---|---|---|---|---|---|
| S9 | S10 | S11 | IO0 | IO1 | IO2 | IO3 | IO4 | IO5 | IO6 | IO7 |
| 0 | 0 | 0 | A0 | A2 | A4 | A6 | A8 | A10 | A12 | A14 |
| 0 | 0 | 1 | A1 | A3 | A5 | A7 | A9 | A11 | A13 | A15 |
| 0 | 1 | 0 | A2 | A4 | A6 | A8 | A10 | A12 | A14 | A0 |
| 0 | 1 | 1 | A3 | A5 | A7 | A9 | A11 | A13 | A15 | A1 |
| 1 | 0 | 0 | A4 | A6 | A8 | A10 | A12 | A14 | A0 | A2 |
| 1 | 0 | 1 | A5 | A7 | A9 | A11 | A13 | A15 | A1 | A3 |
| 1 | 1 | 0 | A6 | A8 | A10 | A12 | A14 | A0 | A2 | A4 |
| 1 | 1 | 1 | A7 | A9 | A11 | A13 | A15 | A1 | A3 | A5 |

Figure 16:
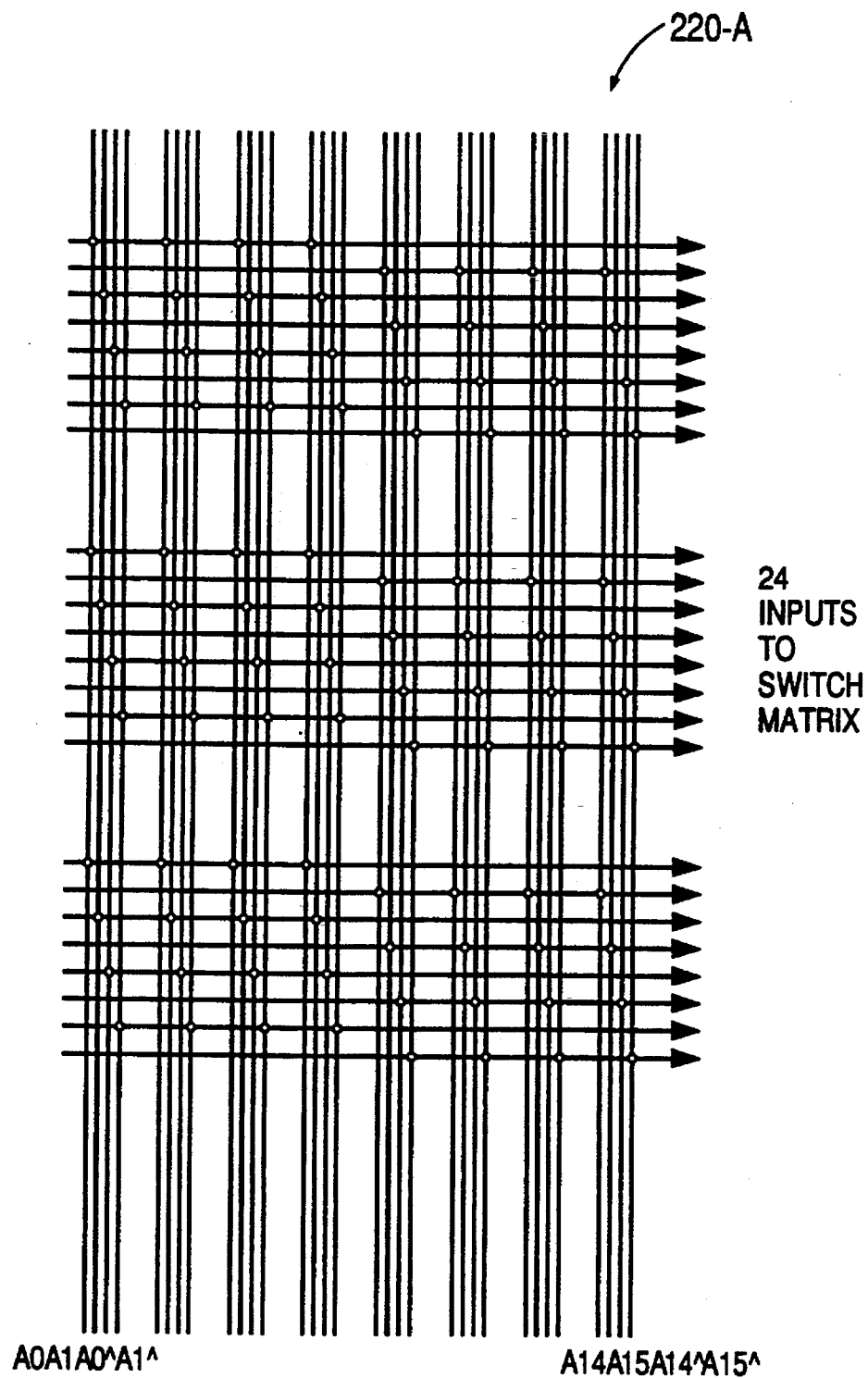
FIG. 16 is a schematic diagram of another embodiment of one bank of the programmable input switch matrix of this invention.

Table 11 illustrates that each output signal has at least three different paths to an I/O pin. For example, signal A0 from macrocell BC0 can be routed to I/O Pins IO0, IO5, A second embodiment of input switch matrix bank 220-A of this invention is illustrated in FIG. 16. In this embodiment, input switch matrix bank 220-A also includes a multiplicity of four-to-one programmable multiplexers. In FIG. 16, the vertical lines again represent signal input lines to input switch matrix bank 220-A. Specifically, the thirty-two vertical lines are clustered in groups of four lines. The first cluster of four lines on the left hand side of FIG. 16 are connected to lines A0, A1, A0 and A1, respectively. The second cluster of four lines on the left hand side of FIG. 16 are connected to lines A2, A3, A2 and A3, respectively. This pattern of connection of the input lines is continued and the last cluster of four lines on the left hand side of FIG. 16 are connected to lines A14, A15, A14 and A15.

Twenty-four horizontal lines SAI0 to SAI23 are again each an input line to centralized switch matrix 230. The circles at the intersections of the horizontal and vertical lines represent programmable connections. Hence, the circles on a particular horizontal line represent the four programmable connections between four input lines and the output line of the particular programmable multiplexer.

Figure 17:
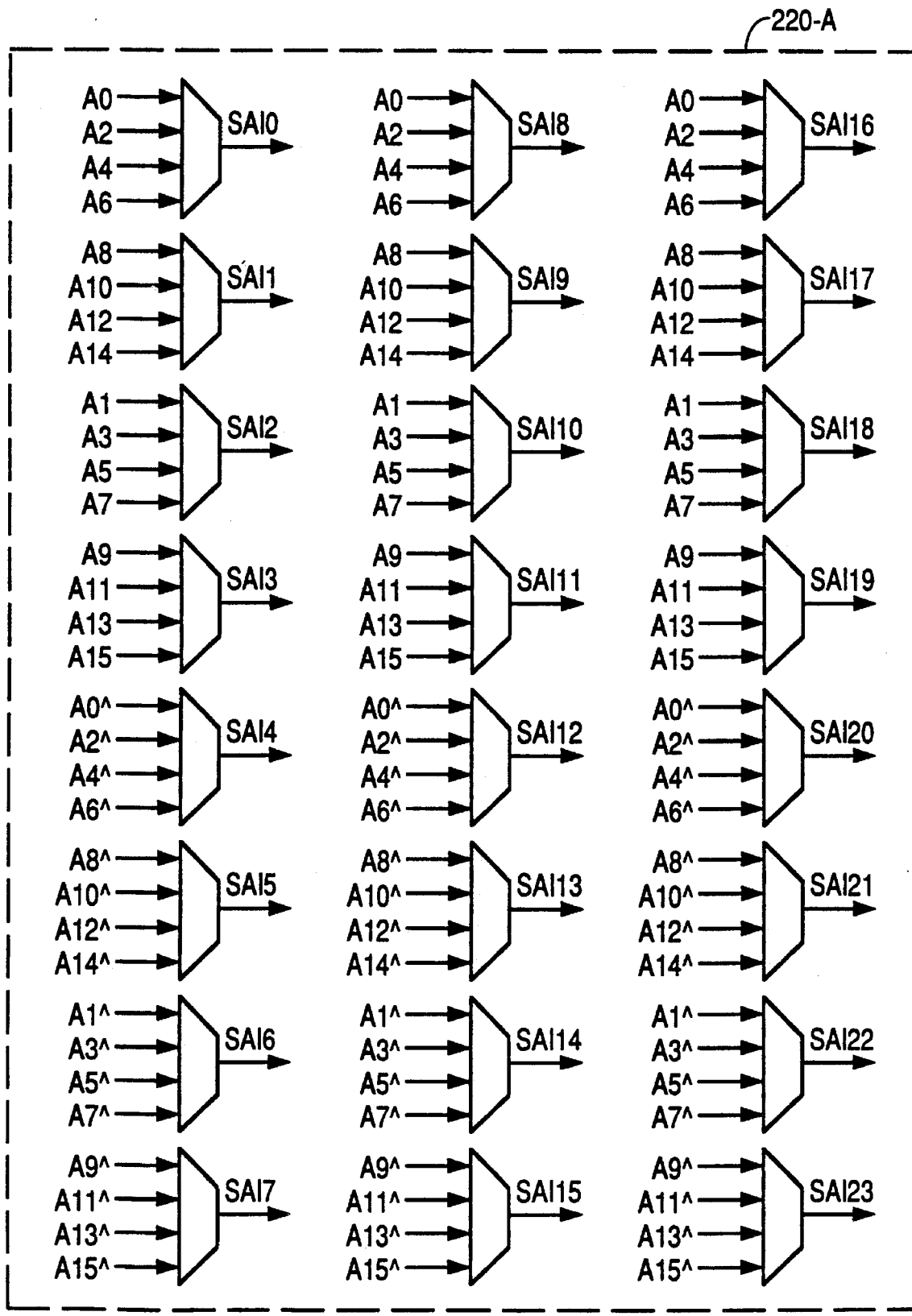
FIG. 17 is an alternative illustration of the bank of the programmable input switch matrix of FIG. 16.

The input lines to a particular multiplexer are shown in more detail in FIG. 17. In this embodiment, the cluster of four input lines are connected to twenty-four programmable multiplexers. In view of this disclosure, one skilled in the art may use a wide variety of programmable multiplexers in input switch matrix bank 220-A. An important aspect is that each input signal to input switch matrix bank 220-A has at least three different paths through the switch matrix.

Table 12 illustrates the selection of feedback signals A(N) and A(N+1) from two adjacent logic macrocells, feedback signal A(N) from the associated I/O pin and feedback signal A(N+1) from the associated input macrocell for a particular configuration of architectural cells S12 and S13. In this embodiment, input switch matrix bank 220-A is a plurality of two-to-one programmable multiplexers.

TABLE 12

| Architectural Cell | | Input Switch Matrix Output Line | | |
| --- | --- | --- | --- | --- |
| S12 | S13 | SAI0 | SAI1 | SAI2 |
| 0 | 0 | A(N)^ | A(N) | A(N + 1) |
| 0 | 1 | A(N + 1)^ | A(N)^ | A(N + 1) |
| 1 | 0 | A(N + 1)^ | A(N) | A(N)^ |
| 1 | 1 | A(N + 1)^ | A(N) | A(N + 1) |

Table 12 shows that in this embodiment each feedback signal has three changes of reaching centralized switch matrix 230 so each feedback signal is treated uniformly.

The above discussion has considered the structure of the components in PLD 100 that have the alphanumeric character "A" in the reference numeral. The other seven sets of components in PLD 100 are identical to those described above. Thus, the above description is incorporated herein by reference for each of the other seven sets of components. Moreover, the general structure with a programmable logic block, input switch matrix bank and output switch matrix bank can be used to form a PLD with any number of blocks containing these components.

Centralized Switch Matrix

Centralized switch matrix 130 (FIG. 1), sometimes called "a centralized switch interconnection means," receives twenty-four input signals from each bank of input switch matrix 120. Hence, in this embodiment, there are 192 input lines to centralized switch matrix 130 from input switch matrix 120. Six dedicated input pins also provide input signals to centralized switch matrix 130. Thus, there are a total of 198 input lines to centralized switch matrix 130.

To assure adequate routability as the PLD architecture is scaled to higher densities, each input signal must have at least three different paths through centralized switch matrix 130. In addition, to provide enhanced logic capability and signal routability, there are thirty-three output lines from centralized switch matrix 130 to each programmable logic block in this embodiment.

The number of output lines, the number of input signals and the routability factor fixes the minimum size of the programmable multiplexers of centralized switch matrix. Specifically, $$\text{Mux size} = \frac{\text{(Number of input lines)} \times \text{(routability factor)}}{\text{Number of muxes}}$$
$$= (198 \times 3)/33 = 18$$

Hence, in this embodiment, centralized switch matrix 130 includes eight banks of thirty-three programmable 18:1 multiplexers. Centralized switch matrix 130 in conjunction with input switch matrix 120 provides full global connectivity where each programmable logic block has access to all global signals.

One embodiment of centralized switch matrix 130 suitable for use with programmable logic block constructed from either programmable logic cell 900A or programmable logic cell 900B is illustrated in FIGS. 18A through 18D. For ease of presentation, the eight programmable logic blocks 101-A to 101-H are represented as blocks "A" to "H" respectively. The input switch matrix lines for each block are numbered from 0 to 23. Thus, the lines from bank 140-A of input switch matrix 140 are represented by A00 to A23. FIGS. 19A through 19D use the same nomenclature as FIGS. 18A to 18D and illustrate another method for routing signals through centralized switch matrix 130. In both embodiments, each input signal has at least three paths through centralized switch matrix 130. Therefore, centralized switch matrix 130 has a routability factor of at least 3.

Figure 20A:
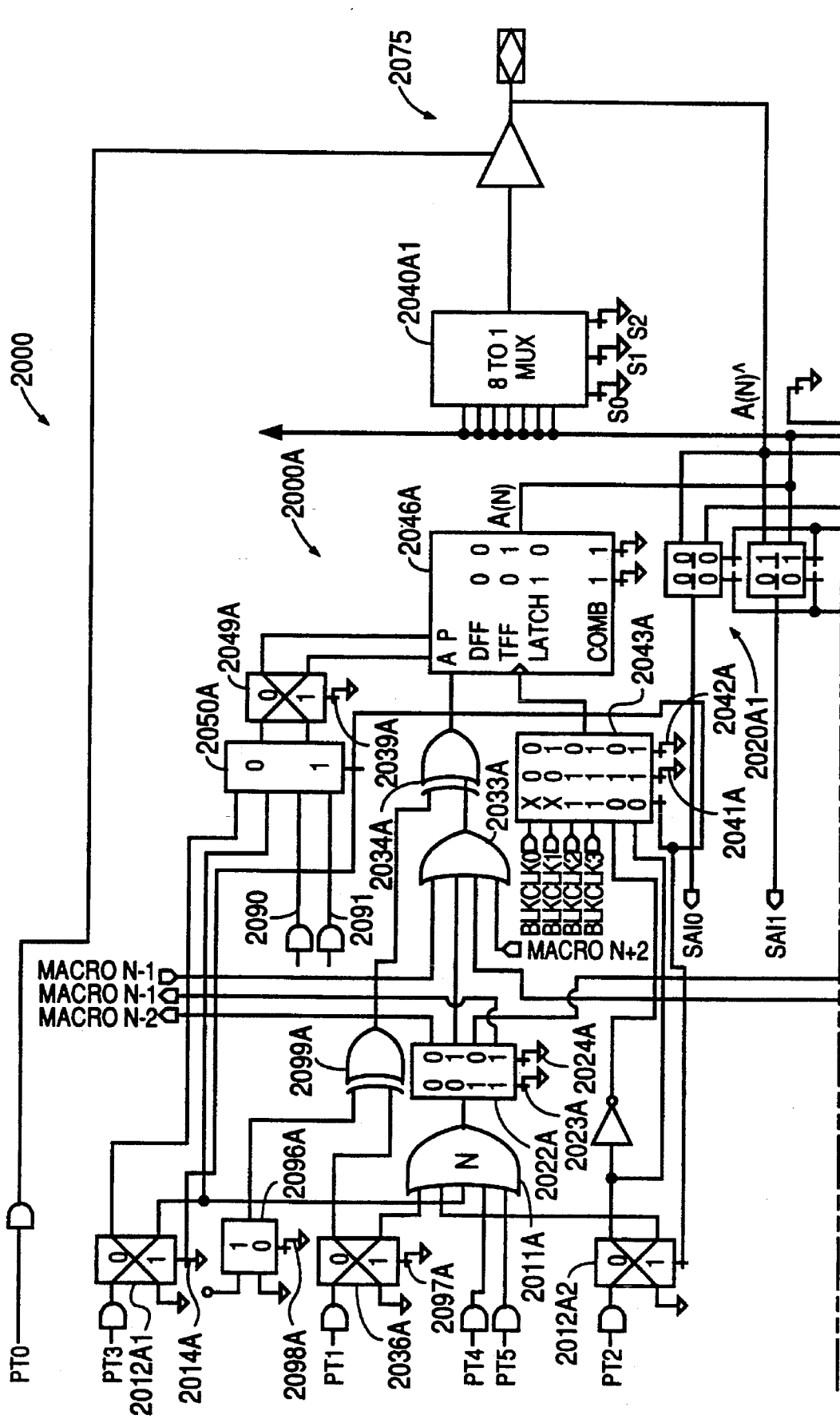
FIGS. 20A and 20B are detailed schematic diagrams of the programmable logic device cell of this invention.
Figure 20B:
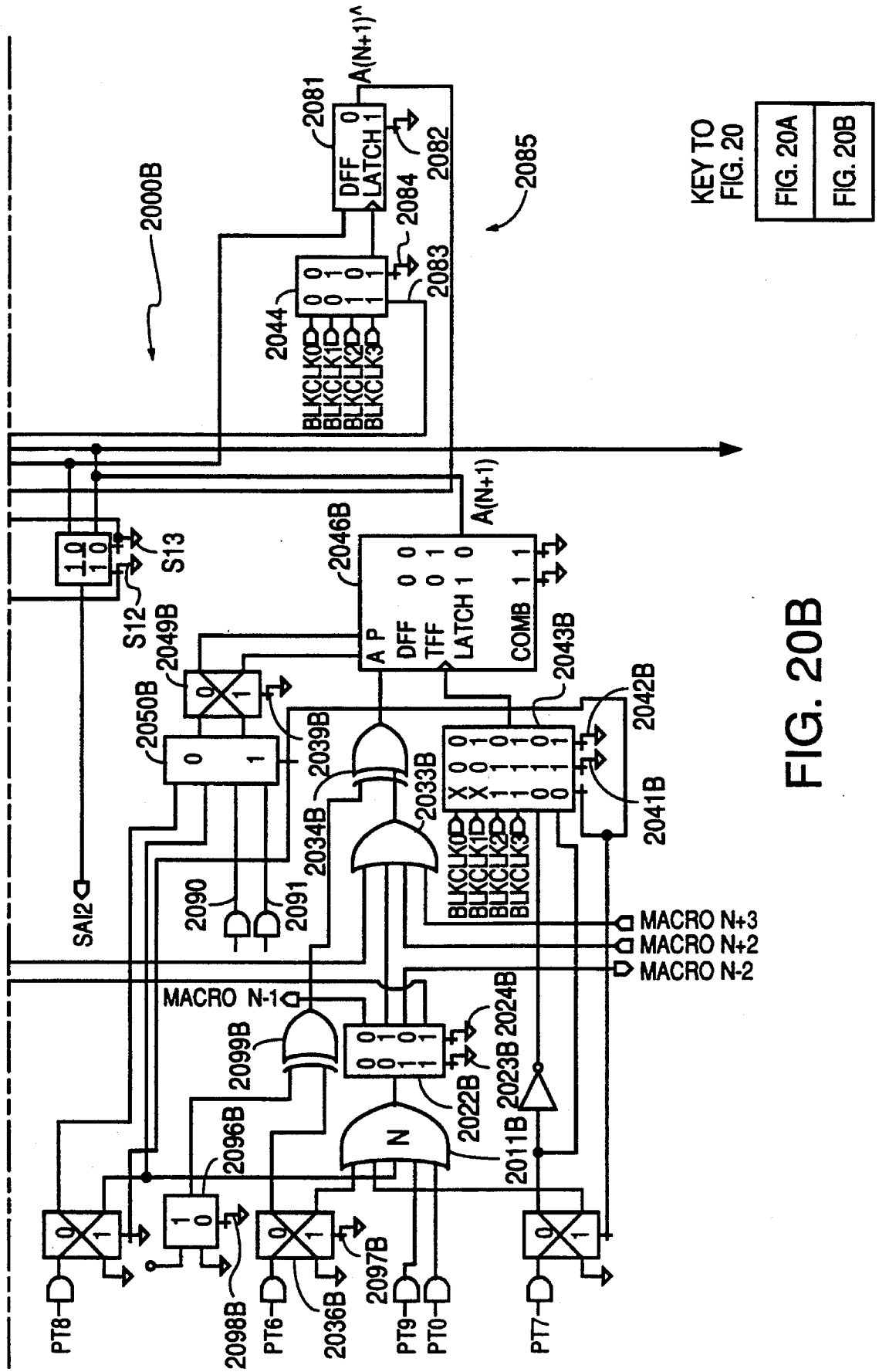

FIGS. 20A and 20B are a detailed schematic of a programmable logic device (PLD) cell 2000 according to the principles of this invention. PLD cell 2000 includes two programmable logic block cells 2000A and 2000B which are the equivalent of programmable logic block cell 900B of this invention, as described above. PLD cell 2000 also includes an I/O cell 2075 and an input macrocell 2085. In addition PLD cell 2000 includes a sub-bank 2040A1 of programmable output switch matrix bank 240-A (FIG. 2) and a sub-bank 2020A1 (FIGS. 20A and 20B) of programmable input switch matrix bank 220-A (FIG. 2).

Thus, according to the principles of this invention, a PLD is formed by using PLD cell 2000 to build a programmable logic block with a bank of the input switch matrix and a bank of the output switch matrix along with a plurality of I/O cells and a plurality of input macrocells. The programmable logic blocks formed have the input lines driven only by signals from a centralized switch matrix and the centralized switch matrix receives input signals only from the input switch matrix and optionally a plurality of dedicated input pins. Of course, the signals from the dedicated input pins could also be routed through the input switch matrix.

In PLD cell 2000, the components of, and operation of input macrocell 2085 and I/O cell 2075 are identical to that described above for input macrocell 1185 and I/O cell 1175 and that description is incorporated herein by reference. The function and operation of the three 2:1 programmable multiplexers that form input switch matrix sub-bank 2020A1 are defined by Table 12 above, which is incorporated herein by reference. Sub-bank 2020A1 shows that specific configuration of the input signals to the three 2:1 programmable multiplexers that gives each of four input signals A(N), A(N), A(N+1), A(N+1)three chances of entering the centralized switch matrix via lines SAI0, SAI1, and SAI2. Specifically, signal A(N)is applied to three of the six input terminals and signals A(N), A(N+1), and A(N+1)are applied to the three remaining input terminals so that each of the signals is applied to a different input terminal.

Output switch matrix sub-bank 2040A1, in this embodiment, is an 8:1 programmable multiplexer whose operation and function is illustrated by any one column of Table 11, which is incorporated herein by reference. In programmable logic block cells 2000A and 2000B, OR gates 2011A and 2011B, demultiplexers 2022A and 2022B, OR gates 2033A and 2033B, exclusive OR gates 2034A and 2034B, programmable logic elements 2046A and 2046B, programmable asynchronous signal source selectors 2050A and 2050B, programmable signal connectors 2049A and 2049B and clock multiplexers 2043A and 2043B function and operate in a manner identical to the corresponding component in cell 900B. Here, the corresponding component means the same component and that component is identified by the same two digits in the tens and ones position of the reference numeral. Notice, however, that asynchronous control product terms 2090 and 2091 are shown in both FIGS. 20A and 20B. This is for convenience only and in fact they are the same product terms and are shared as described above.

One embodiment of programmable polarity control element 937 and its architectural cells and programmable connection 912 and it connections are illustrated in FIGS. 20A and 20B. The elements making up these two components are identical except that in programmable logic block cell 2000A the five product terms in the cluster are identified as product terms PT1 to PT5 and in programmable logic block cell 2000B as product terms PT6 to PT10. Thus, only the components in FIG. 20A are described herein.

Programmable polarity control element 937 includes 2:1 programmable multiplexer 2096A with architectural cell 2098A and exclusive OR gate 2099A. Programmable connection 2036A has product term PT1 connected to a first input terminal and a second output terminal is grounded. When architectural cell 2097A is configured to provide a logic zero input select signal to programmable connection 2036A, programmable connection 2036A steers product term PT1 to OR gate 2011A and the other output terminal is grounded so that a logic zero signal is applied to one input terminal of exclusive OR gate 2099A.

The other input terminal of exclusive OR gate 2099A is connected to the output terminal of 2:1 programmable multiplexer 2096A. The output terminal of exclusive OR gate 2099A is connected to one input terminal of exclusive OR gate 2034A. One input terminal of 2:1 programmable multiplexer 2096A is connect to power supply voltage Vcc and the other input terminal is grounded.

When architectural cell 2098A is configured to provide a logic zero input select signal to 2:1 programmable multiplexer 2096A, multiplexer 2096A passes the ground level to the output terminal and conversely. Thus, if active high polarity is desired from exclusive OR gate 2034A when product term PT1 is steered to OR gate 2011A, multiplexer 2096A is configured to pass the grounded level to exclusive OR gate 2099A, which in turn generates a logic zero level signal that is applied to the input terminal of exclusive OR gate 2034A. Conversely, if active low polarity is desired, the power supply voltage is passed through multiplexer 2096A to exclusive OR gate 2099A and consequently to exclusive OR gate 2033A. Multiplexer 2096A is used also to control the polarity when product term PT1 is steered to exclusive OR gate 2099A.

In this embodiment programmable connection 912 included two programmable connections 2012A1 and 2012A2. A first input terminal of programmable connection 2012A1 is driven by product term PT3 and a second input terminal is grounded. A first output terminal drives a first input terminal of programmable asynchronous signal source selector 2050A and a second output terminal drives a second input terminal of programmable asynchronous signal source selector 2050A and an input terminal of OR gate 2011A.

A first input terminal of programmable connection 2012A2 is driven by product term PT2 and a second input terminal is grounded. A first output terminal drives provides a clock signal for programmable clock multiplexer 2043A and a second output terminal drives an input terminal of OR gate 2011A.

When architectural cell 2014A is configured to provide a particular input select signal to programmable connection 2012A1, the input select signal is also provided to programmable asynchronous signal source selector 2050A, programmable clock multiplexer 2043A, and programmable connection 2012A. Thus, when programmable connection 2012A1 steers product term PT3 to OR gate 2011A, programmable connection 2012A2 steers product term PT2 to OR gate 2011A. In one embodiment, this occurs when architectural cell 2014A is configured to provide a logic one level signal to programmable connections 2012A1 and 2012A2. Notice that when product term PT3 is steered to OR gate 2011A, in this embodiment, product term PT3 is also steered to the second input terminal of programmable asynchronous signal selector.

When architectural cell 2014A is configured to provide a logic zero level signal to programmable connections 2012A1 and 2012A2, product terms PT2 and PT3 are used for asynchronous applications. Product term PT2 is an individual clock signal and product term PT3 is used either for asynchronous preset or asynchronous reset.

Figure 21:
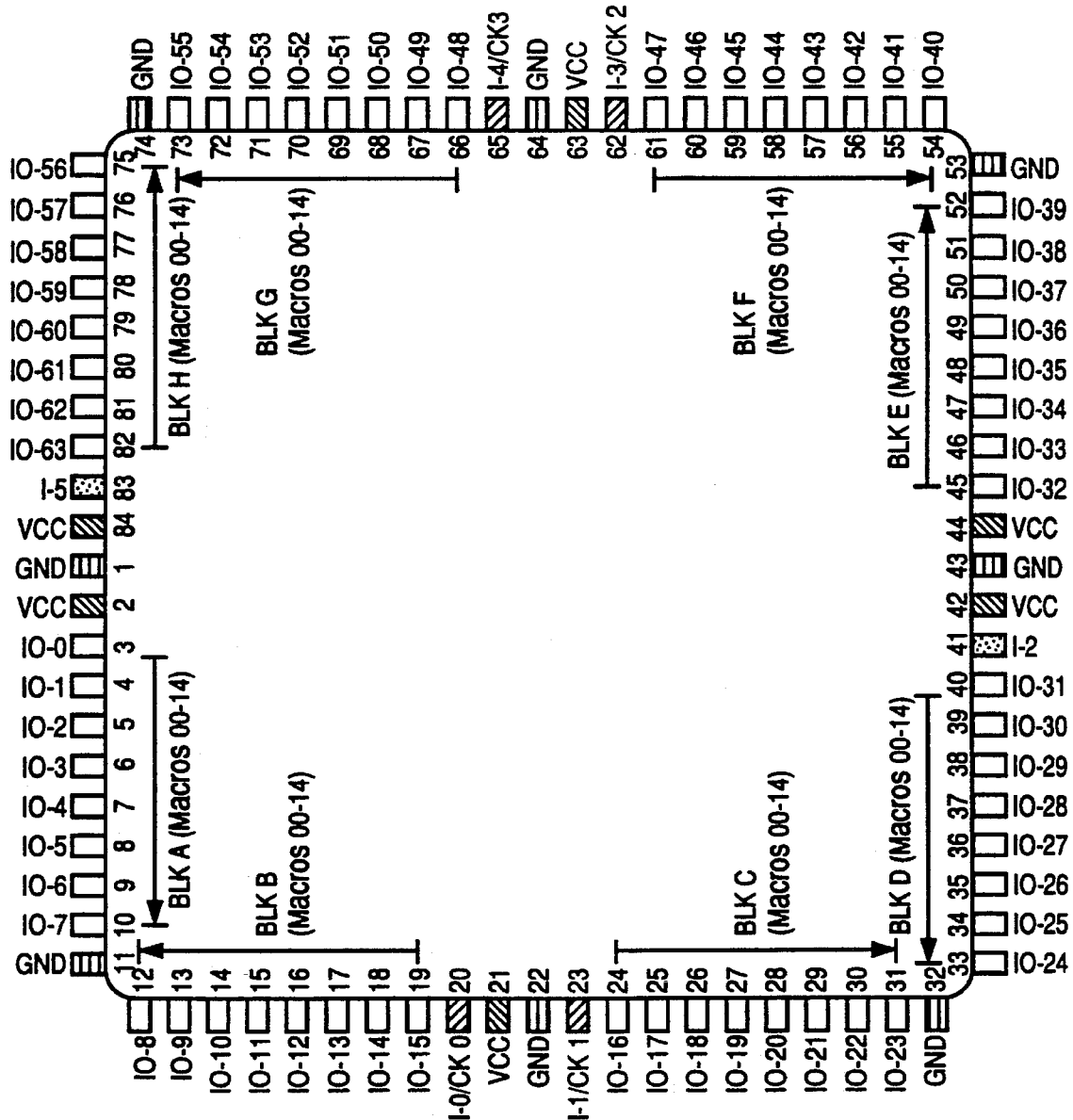
FIG. 21 is a detailed block diagram of the pin-out for one embodiment of the PLD of this invention.

FIG. 21 is a diagram of one embodiment for the pin-out for the PLDs described above. The 84 pin package has 64 I/O pins IO-0 to IO-63, two dedicated input pins I-2, I-5, four global clock/dedicated input pins I-0/CK0, I-1/CK1, I-3/CK3, I-4/CK4, six power supply pins VCC and eight ground pins. The six power supply pins are arranged so that two parallel sides of the package have two power supply pins each and the other two parallel sides have one power supply pin each. Each side of the package has two ground pins.

Figure 22:
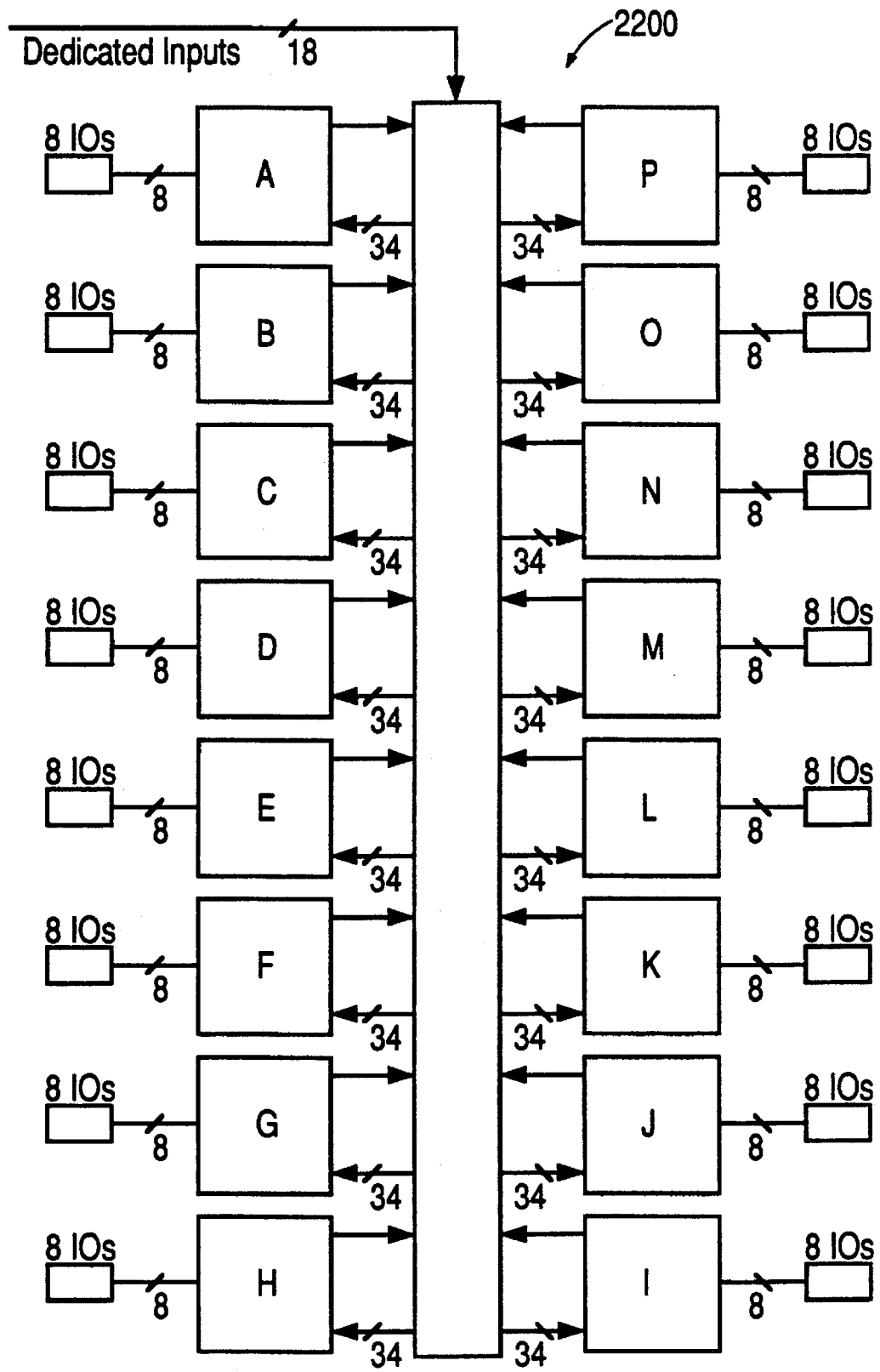
FIG. 22 is a block diagram of another PLD of this invention.

In another embodiment of this invention, PLD cell 2000 is used to construct blocks 2200-A to 2200-P (FIG. 22) in PLD 2200. Thus, PLD 2200 has a 16 bank programmable input switch matrix, a 16 bank programmable output switch matrix, and 16 programmable logic blocks. PLD 2200 has a total of 128 input/output pins with 8 I/O pins per block.

PLD 2200 has a total of 256 macrocells, and 128 input macrocells as well as 18 dedicated input pins. Thus, the total number of input signals to the centralized switch matrix is 402. (24 signals per bank of input switch matrix×16 banks+ 18 dedicated input signals). In one embodiment, the 402 signals are 128 signals from I/O pins, 128 input macrocell feedback signals, 128 logic macrocell feedback signals and 18 dedicated input signals.

In this embodiment, each programmable logic block receives thirty-four input signals from the centralized switch matrix and each input line is driven by a programmable 36:1 multiplexer. Thus, the maximum number of input lines to the centralized switch matrix is 34 multiplexers times 36 input lines per multiplexer or 1,224 input lines. Four hundred two input signals drive the 1,224 input lines so that each signal has 3.04 paths on the average through the centralized switch matrix.

In one embodiment, PLD 2200 is contained in a 196 pin QFP package. The package has 128 I/O pins, 18 dedicated input pins, 44 power supply and ground pins, and six pins for five volt in circuit programmability and JTAG capability.

As described above, the programmable logic devices of this invention have a plurality of programmable connections. In one embodiment, the programmable connections are controlled by a multiplicity of electrically erasable cells. The number of electrically erasable cells depend upon the specific implementation, but the number of electrically erasable cells for the embodiment illustrated in FIG. 1 is given in Table 13. In view of this disclosure, one skilled in the art can design PLDs according to the principles of this invention with differing numbers of erasable cells. Accordingly, the following Table is illustrative only and is not intended to limit the invention to the number of cells indicated.

TABLE 13

| Device 100 | | |
|---|---|---|
| $E^2$ cells for the AND-OR array | $8 \times 66 \times 90 =$ | 47,520 |
| $E^2$ cells for the programmable logic macrocells | $8 \times 16 \times 7 =$ | 896 |
| $E^2$ cells for the programmable input macrocells | $8 \times 8 \times 3 =$ | 192 |
| $E^2$ cells for the logic allocator | $8 \times 16 \times 2 =$ | 256 |
| $E^2$ cells for the output switch matrix | $8 \times 8 \times 3 =$ | 192 |
| $E^2$ cells for the input switch matrix | $8 \times 8 \times 2 =$ | 128 |
| $E^2$ cells for the centralized switch matrix | $8 \times 33 \times 18 =$ | 4752 |
| | TOTAL | 53,936 |

In another embodiment, the number of electrically erasable cells for the PLD constructed using programmable logic block cell 900B is given in Table 14.

TABLE 14

| 8 Block PLD Formed Using Cell 900B | | |
|---|---|---|
| $E^2$ cells for the AND-OR array | $8 \times 66 \times 90 =$ | 47,520 |
| $E^2$ cells for the programmable logic macrocells | $8 \times 16 \times 11 =$ | 1408 |
| $E^2$ cells for the programmable input macrocells | $8 \times 8 \times 3 =$ | 192 |
| $E^2$ cells for the logic allocator | $8 \times 16 \times 2 =$ | 256 |
| $E^2$ cells for the output switch matrix | $8 \times 8 \times 3 =$ | 192 |
| $E^2$ cells for the input switch matrix | $8 \times 24 \times 2 =$ | 384 |
| $E^2$ cells for the centralized switch matrix | $8 \times 33 \times 18 =$ | 4752 |
| | TOTAL | 54,704 |

In yet another embodiment, the number of electrically erasable cells for PLD 2200 constructed using programmable PLD cell 2000 is given in Table 15.

TABLE 15

| Device 2200 | | |
|---|---|---|
| $E^2$ cells for the AND-OR array | $16 \times 68 \times 90 =$ | 97,920 |
| $E^2$ cells for the programmable logic macrocells | $16 \times 16 \times 11 =$ | 2816 |
| $E^2$ cells for the programmable input macrocells | $16 \times 8 \times 3 =$ | 384 |
| $E^2$ cells for the logic allocator | $16 \times 16 \times 2 =$ | 512 |
| $E^2$ cells for the output switch matrix | $16 \times 8 \times 3 =$ | 384 |
| $E^2$ cells for the input switch matrix | $16 \times 24 \times 2 =$ | 768 |
| $E^2$ cells for the centralized switch matrix | $16 \times 34 \times 36 =$ | 19,584 |
| | TOTAL | 122,368 |

In the preceding discussion, for ease of expression, only programmable architectural cells have been described. The cells in these applications may be fuses, EPROM cells, EEPROM cells, RAM cells, or CMOS antifuse technology in accordance with the invention. The architectural cells are a means for providing either an input select signal or an output select signal to a programmable component so that the component passes a desired signal therethrough.

The preceding discussion has described a programmable AND/OR array as an assembly of AND gates used to form products of logical variables, followed by an assembly of OR gates to form sums of such product terms. However, using logical transforms known to those skilled in the art, in one embodiment the programmable AND, fixed OR array (AND/OR array) is replaced by a programmable NOR, fixed NOR array. The use of NOR logic provides enhanced speed over the equivalent programmable AND/OR array, but the logic functions of the two arrays are equivalent.

The AND/OR array also may include inverters that form complements ($\overline{A}$) of the input signals (A). The AND/OR array may also be arranged as an assembly of OR gates to form sums of logical variables, followed by an assembly of AND gates to form products of such sums, by utilizing the DeMorgan theorems $$\overline{A \cdot B} = \overline{A} + \overline{B},$$

$$\overline{A + B} = \overline{A} \cdot \overline{B}$$

in a manner well known to those of ordinary skill in the art. For example, the sum of logical product terms A·B+C·D+ E·F·G may be written as the complement of the product of sums of complemented variables, viz $$A \cdot B + C \cdot D + E \cdot F \cdot G = \overline{(\overline{A} + \overline{B}) \cdot (\overline{C} + \overline{D}) \cdot (\overline{E} + \overline{F} + \overline{G})}$$

For ease of reference, a logical sum of logical products and a logical product of logical sums are collectively referred to herein as "logical sum/product terms."

Using the DeMorgan theorems applied above and incorporating signal inverters in the signal paths, one can also express the gate configuration in terms of programmable OR gates and fixed AND gates. More generally, one may configure the gates in a PLA mode, wherein both AND gates and OR gates are programmable.

All programmable logic macrocells and input macrocells in the PLDs of this invention are designed to be reset during power-up. Following the power-up, all programmable logic macrocells and input macrocells are cleared, setting the output signals to a logical zero. This feature is especially valuable in simplifying state machine initialization.

A security cell is provided on each device to prevent unauthorized copying of the user's proprietary logic design. Once programmed, the security cell disables the programming and verification modes. The only way to erase the protection cell is by charging the entire array architecture cells. This cell should preferably be programmed only after the rest of the device has been completely programmed.

The programmable logic devices of this invention are designed with supervoltage enabled preload circuitry that provides an easy method for testing the logic functionality. The preload function allows any arbitrary state value to be loaded into logic macrocells. A typical functional test sequence would verify all possible state transitions for the device being tested. This requires the ability to set the registers into an arbitrary "present state" and to set the device into an arbitrary "present input" value. Once this is done, the state machine is clocked into a new state, or next state which is checked to validate the transition from the "present state." In this way, any particular state transition can be checked.

Since the preload function allows the device to go directly into any desired state, test sequences may be greatly shortened. Also, all possible values can be tested, thus greatly reducing both test time and development costs and guaranteeing proper in-system operation.

An observability mode allows the ability to observe the contents of internal state or output registers on corresponding I/O pins for testability. This observability mode is entered by applying a supervoltage to certain pins. Once this mode is entered, it suppresses the combinatorial output data from appearing on the I/O pins and allows the observation of the contents of output registers on the output pins corresponding to the programmable logic macrocells. This allows easy debugging and tracing of the buried registers.

This application is related to copending, commonly assigned and commonly filed U.S. patent application Ser. No. 07/909,557 entitled "FLEXIBLE SYNCHRONOUS/ASYNCHRONOUS CELL STRUCTURE FOR A HIGH DENSITY PROGRAMMABLE LOGIC DEVICE," of Om P. Agrawal et al., now U.S. Pat. No. 5,260,504 issued on Nov. 9, 1993, and to copending, commonly assigned and commonly filed U.S. patent application Ser. No. 08/924,805 entitled "ARCHITECTURE OF A MULTIPLE ARRAY PROGRAMMABLE LOGIC DEVICE WITH A PLURALITY OF PROGRAMMABLE SWITCH MATRICES," OF Om P. Agrawal et al., now U.S. Pat. No. 5,457,408 issued on Oct. 10, 1995 both of which are incorporated herein by reference in their entirety.

The above embodiments are only illustrative of the principles of this invention and are not intended to limit the invention to the particular embodiments described. In view of this disclosure those skilled in the art will be able to generate a wide variety of PLDs that are high speed and easily scalable to higher densities.

I claim:

1. An integrated circuit having a plurality of pins comprising;

a plurality of programmable logic blocks, each programmable logic block having a plurality of input lines and a plurality of output lines so that said plurality of programmable logic blocks has pluralities of input lines and pluralities of output lines;

a programmable input switch interconnection matrix, operatively coupled to each of said programmable logic blocks, comprising a plurality of programmable input switch matrix banks with each programmable input switch matrix bank having a plurality of input lines and a plurality of output lines so that said plurality of programmable input switch matrix banks has pluralities of input lines and pluralities of output lines;

wherein input lines in said plurality of input lines of said programmable input switch matrix bank are coupled to output lines in said plurality of output lines of one programmable logic block; and further wherein said programmable input switch matrix bank selectively connects and disconnects at least one of said input lines in said plurality of input lines of said programmable input switch matrix bank to at least two different output lines in said plurality of output lines of said programmable input switch matrix bank; and a programmable centralized switch interconnection matrix, operatively coupled to each of said programmable logic blocks and to said programmable input switch interconnection matrix, having a plurality of input lines and a plurality of output lines;

wherein input lines in said plurality of input lines of said programmable centralized switch interconnection matrix are coupled to said pluralities of output lines of said plurality of programmable input switch matrix banks; and further wherein said programmable centralized switch matrix selectively connects and disconnects signals on said plurality of input lines of said programmable centralized switch interconnection matrix to said pluralities of input lines of said plurality of programmable logic blocks.

2. The integrated circuit of claim 1 wherein said programmable input switch matrix bank comprises a plurality of programmable multiplexers connected to said plurality of input lines and to said plurality of output lines of said programmable input switch matrix bank.

3. The integrated circuit of claim 2 wherein said plurality of programmable multiplexers comprises programmable 2:1 multiplexers.

4. The integrated circuit of claim 2 wherein said programmable multiplexers in said plurality of programmable multiplexers have a size such that said programmable input switch matrix bank has a routability factor of at least 3.0.

5. The integrated circuit of claim 2 wherein said programmable multiplexers in said plurality of programmable multiplexers have a size such that each input signal to said programmable input switch matrix bank has more than one chance of passing therethrough.

6. The integrated circuit of claim 2 wherein said plurality of programmable multiplexers comprises programmable 4:1 multiplexers.

7. The integrated circuit of claim 1 wherein each of said programmable logic blocks is identical.

8. The integrated circuit of claim 1 wherein said plurality of programmable logic block input lines comprises 33 input lines.

9. The integrated circuit of claim 1 wherein said plurality of programmable logic block input lines comprises 34 input lines.

10. The integrated circuit of claim 1 wherein said programmable centralized switch interconnection matrix comprises a plurality of programmable multiplexers connected to said pluralities of input lines and to said pluralities of output lines of said programmable centralized switch interconnection matrix.

11. The integrated circuit of claim 10 wherein said plurality of programmable multiplexers comprises programmable 36:1 multiplexers.

12. The integrated circuit of claim 10 wherein said plurality of programmable multiplexers have a size such that said programmable centralized switch interconnection matrix has a routability factor of at least 3.0.

13. The integrated circuit of claim 10 wherein said plurality of programmable multiplexers comprises programmable 18:1 multiplexers.

14. The integrated circuit of claim 1 wherein at least one pin in said plurality of pins is a dedicated input pin.

15. The integrated circuit of claim 14 wherein said dedicated input pin is connected to said programmable centralized switch interconnection matrix.

16. The integrated circuit of claim 1 further comprising:
   programmable output switch interconnection matrix, operatively coupled to each of said programmable logic blocks and to a set of said plurality of pins, comprising a plurality of output switch matrix banks with each output switch matrix bank having a plurality of input lines and a plurality of output lines;
   wherein said plurality of input lines of said programmable output switch matrix bank are coupled to said plurality of output lines of one programmable logic block; and
   further wherein said programmable output switch interconnection matrix selectively couples and decouples each line in said set of said plurality of input lines to a pin in said set pins in said plurality of pins.

17. The integrated circuit of claim 16 wherein said set of plurality of pins comprises input/output pins.

18. The integrated circuit of claim 17 wherein said programmable output switch matrix bank comprises a plurality of programmable multiplexers connected to said pluralities of input lines and to said pluralities of output lines of said programmable output switch matrix bank.

19. The integrated circuit of claim 18 further wherein said plurality of programmable multiplexers have a size such that said programmable output switch matrix has a routability factor of at least 3.0.

20. The integrated circuit of claim 18 wherein said plurality of programmable multiplexers comprises programmable 8:1 multiplexers.

21. An integrated circuit having a plurality of pins comprising:
   a plurality of programmable logic blocks, each programmable logic block having a plurality of input lines and a plurality of output lines so that said plurality of programmable logic blocks has pluralities of input lines and pluralities of output lines;
   a programmable input switch interconnection matrix, operatively coupled to each of said programmable logic blocks, comprising a plurality of programmable input switch matrix banks with each programmable input switch matrix bank having a plurality of input lines and a plurality of output lines so that said plurality of programmable input switch matrix banks has pluralities of input lines and pluralities of output lines;
   wherein input lines in said plurality of input lines of said programmable input switch matrix bank are coupled to output lines in said plurality of output lines of one programmable logic block; and
   further wherein said programmable input switch matrix bank selectively connects and disconnects least one of said input lines in said plurality of input lines of said programmable input switch matrix bank to at least two different output lines in said plurality of output lines of said programmable input switch matrix bank;
   a programmable centralized switch interconnection matrix, operatively coupled to each of said programmable logic blocks and to said programmable input switch interconnection matrix, having a plurality of input lines and a plurality of output lines;
   wherein input lines in said plurality of input lines of said programmable centralized switch interconnection matrix are coupled to output lines in said pluralities of output lines of said plurality of programmable input switch matrix banks; and
   further wherein said programmable centralized switch interconnection matrix selectively connects and disconnects signals on said plurality of input lines of said programmable centralized switch interconnection matrix to said pluralities of input lines of said plurality of programmable logic blocks
   a programmable output switch interconnection matrix, operatively coupled to each of said programmable logic blocks, comprising a plurality of output switch matrix banks with each output switch matrix bank having a plurality of input lines; and having a plurality of output lines coupled to a set of pins in said plurality of pins;
   wherein input lines in said plurality of input lines of said programmable output switch matrix bank are coupled to output lines in said plurality of output lines of one programmable logic block; and
   further wherein said programmable output switch matrix bank selectively couples and decouples each of said input lines in said plurality of input lines of said programmable output switch matrix bank to a pin in said set pins in said plurality of pins.

22. The integrated circuit of claim 21 wherein said plurality of programmable logic block input lines comprises 33 input lines.

23. The integrated circuit of claim 21 wherein said plurality of programmable logic block input lines comprises 34 input lines delay.

24. The integrated circuit of claim 21 wherein each of said programmable logic blocks is identical.

25. The integrated circuit of claim 21 wherein said programmable input switch matrix bank comprises a plurality of programmable multiplexers connected to said plurality of input lines and to said plurality of output lines of said programmable input switch matrix bank.

26. The integrated circuit of claim 25 wherein said plurality of programmable multiplexers comprises programmable 2:1 multiplexers.

27. The integrated circuit of claim 25 wherein said programmable multiplexers in said plurality of programmable multiplexers have a size such that said programmable input switch matrix bank has a routability factor of at least 3.0.

28. The integrated circuit of claim 25 wherein said programmable multiplexers in said plurality of programmable multiplexers have a size such that each input signal to said programmable input switch matrix bank has more than one chance of passing therethrough.

29. The integrated circuit of claim 25 wherein said plurality of programmable multiplexers comprises programmable 4:1 multiplexers.

30. The integrated circuit of claim 21 wherein said set of pins in said plurality of pins comprises input/output pins.

31. The integrated circuit of claim 30 wherein said programmable output switch matrix bank comprises a plurality of programmable multiplexers connected to said pluralities of input lines and to said pluralities of output lines of said programmable output switch matrix bank.

32. The integrated circuit of claim 31 further wherein said plurality of programmable multiplexers have a size such that said programmable output switch matrix has a routability factor of at least 3.0.

33. The integrated circuit of claim 31 wherein said plurality of programmable multiplexers comprises programmable 8:1 multiplexers.

34. The integrated circuit of claim 21 wherein said programmable centralized switch interconnection matrix comprises a plurality of programmable multiplexers connected to said pluralities of input lines and to said pluralities of output lines of said programmable centralized switch interconnection matrix.

35. The integrated circuit of claim 34 wherein said plurality of programmable multiplexers have a size such that said programmable centralized switch interconnection matrix has a routability factor of at least 3.0.

36. The integrated circuit of claim 34 wherein said plurality of programmable multiplexers comprises programmable 18:1 multiplexers.

37. The integrated circuit of claim 34 wherein said plurality of programmable multiplexers comprises programmable 36:1 multiplexers.

38. The integrated circuit of claim 21 wherein at least one pin in said plurality of pins is a dedicated input pin.

39. The integrated circuit of claim 38 wherein said dedicated input pin is connected to said programmable centralized switch interconnection matrix.

40. A programmable structure for an integrated circuit programmable logic device comprising:
   a plurality of programmable logic blocks, each programmable logic block having a plurality of input lines and a plurality of output lines; and
   a programmable input switch interconnection matrix, operatively coupled to each of said programmable logic blocks, comprising a plurality of programmable input switch matrix banks with each programmable input switch matrix bank having a plurality of input lines and a plurality of output lines;
      wherein input lines in said plurality of input lines of said programmable input switch matrix bank are coupled to output lines in said plurality of output lines of one programmable logic block; and
      further wherein said programmable input switch matrix bank selectively connects and disconnects at least one of said input lines in said plurality of input lines of said programmable input switch matrix bank to at least two different output lines in said plurality of output lines of said programmable input switch matrix bank.

41. The integrated circuit of claim 40 further comprising:
   programmable output switch interconnection matrix, operatively coupled to each of said programmable logic blocks and to a set of pins in a plurality of pins of said integrated circuit, comprising a plurality of output switch matrix banks with each output switch matrix bank having a plurality of input lines and a plurality of output lines;
      wherein said plurality of input lines of said programmable output switch matrix bank are coupled to said plurality of output lines of one programmable logic block; and
      further wherein said programmable output switch interconnection matrix selectively connects and disconnects each line in said set of said plurality of input lines to a pin in said set pins in said plurality of pins.

42. The integrated circuit of claim 41 wherein said set of pins in said plurality of pins comprise input/output pins.

43. The integrated circuit of claim 42 wherein said programmable output switch matrix bank comprises a plurality of programmable multiplexers connected to said pluralities of input lines and to said pluralities of output lines of said programmable output switch matrix bank.

44. The integrated circuit of claim 43 further wherein said plurality of programmable multiplexers have a size such that said programmable output switch matrix has a routability factor of at least 3.0.

45. The integrated circuit of claim 43 wherein said plurality of programmable multiplexers comprises programmable 8:1 multiplexers.

46. The integrated circuit of claim 40 wherein at least one pin in a plurality of pins of said integrated circuit is a dedicated input pin.

47. The integrated circuit of claim 40 wherein each of said programmable logic blocks is identical.

48. The integrated circuit of claim 40 wherein said programmable input switch matrix bank comprises a plurality of programmable multiplexers connected to said plurality of input lines and to said plurality of output lines of said programmable input switch matrix bank.

49. The integrated circuit of claim 48 wherein said programmable multiplexers in said plurality of programmable multiplexers have a size such that said programmable input switch matrix bank has a routability factor of at least 3.0.

50. The integrated circuit of claim 48 wherein said plurality of programmable multiplexers have a size such that each input signal to said programmable input switch matrix bank has more than one chance of passing therethrough.

51. The integrated circuit of claim 48 wherein said plurality of programmable multiplexers comprises programmable 4:1 multiplexers.

52. The integrated circuit of claim 48 wherein said plurality of programmable multiplexers comprises programmable 2:1 multiplexers.

* * * * *